US007529986B2

(12) United States Patent
Riho et al.

(10) Patent No.: US 7,529,986 B2
(45) Date of Patent: May 5, 2009

(54) SEMICONDUCTOR DEVICE AND TESTING METHOD FOR SAME

(75) Inventors: Yoshiro Riho, Tokyo (JP); Yutaka Ito, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 11/968,664

(22) Filed: Jan. 3, 2008

(65) Prior Publication Data
US 2008/0133985 A1 Jun. 5, 2008

Related U.S. Application Data

(62) Division of application No. 11/092,706, filed on Mar. 30, 2005, now Pat. No. 7,346,829.

(30) Foreign Application Priority Data
Mar. 30, 2004 (JP) ............................. 2004-100579

(51) Int. Cl.
G11C 29/00 (2006.01)
G11C 7/00 (2006.01)
H03M 13/00 (2006.01)
(52) U.S. Cl. .................. 714/710; 714/758; 365/201
(58) Field of Classification Search ................. 714/710, 714/711, 723, 758; 365/201
See application file for complete search history.

(56) References Cited

U.S. PATENT DOCUMENTS

| 4,493,081 A | * | 1/1985 | Schmidt ............ 714/754 |
| 4,719,628 A | | 1/1988 | Ozaki et al. |
| 4,888,773 A | * | 12/1989 | Arlington et al. ........ 714/764 |
| 5,068,855 A | | 11/1991 | Kashida et al. |
| 5,146,589 A | * | 9/1992 | Peet et al. ............ 714/3 |
| 5,291,498 A | | 3/1994 | Jackson et al. |
| 5,778,012 A | | 7/1998 | Branchetti et al. |
| 2001/0014960 A1 | | 8/2001 | Ohyama et al. |

(Continued)

FOREIGN PATENT DOCUMENTS

JP           8-185699           7/1996

(Continued)

OTHER PUBLICATIONS

"Error detecting refreshment for embedded DRAMs" by Hellebrand et al.This paper appears in: VLSI Test Symposium, 1999. Proceedings. 17th IEEE Publication Date: 1999 On pp. 384-390 ISBN: 0-7695-0146-X INSPEC Accession No. 6450986.*

*Primary Examiner*—Cynthia Britt
(74) *Attorney, Agent, or Firm*—Young & Thompson

(57) ABSTRACT

A test method for a semiconductor device that is provided with an ECC circuit that uses product code that is composed of a first code and a second code for implementing error correction of a memory, the test method includes steps of: obtaining first pass/fail determination results and second pass/fail determination results that are realized by independent correction operations based on the first code and the second code, respectively; recording the results in a first fail memory and a second fail memory, respectively; executing a prescribed logical operation such as an AND operation relating to the contents of the first fail memory and the contents of the second fail memory; and based on the results of the logical operation, remedying both fail bits and potential fail bits.

3 Claims, 27 Drawing Sheets

U.S. PATENT DOCUMENTS

| | | |
|---|---|---|
| 2002/0049947 A1 | 4/2002 | Sridharan et al. |
| 2003/0093741 A1 | 5/2003 | Argon et al. |
| 2003/0145274 A1 | 7/2003 | Hwang et al. |
| 2004/0039978 A1 | 2/2004 | Lehobey et al. |
| 2005/0120265 A1 | 6/2005 | Pline et al. |

FOREIGN PATENT DOCUMENTS

| | | |
|---|---|---|
| JP | 2000-137651 | 5/2000 |
| JP | 2002-56671 | 2/2002 |

* cited by examiner

Wafer inspection #1
SDRAM test
Word-line defects, bit-line defects...remedied

| Test is perfomed including parity bit |
|---|

FIG. 10A
(BACKGROUND ART)

Wafer inspection #2
SDRAM test
Bit defects (refresh) ...remedied

| Test is perfomed including parity bit |
|---|
| ECC test: Code #1 and Code #2 function independently with each other by test mode |

FIG. 10B

AND operation of (1) and (2)
Remedy of fail bit

SEMICONDUCTOR DEVICE AND TESTING METHOD FOR SAME

BACKGROUND OF THE INVENTION

1. Field of the Invention

The present invention relates to a semiconductor device that is provided with memory, and more particularly to a semiconductor device that is provided with a product code ECC (Error Checking and Correcting) circuit for correcting errors in memory, and to a method of testing such a device.

2. Description of the Related Art

Of the various methods that are used in a dynamic semiconductor memory device that requires a refresh operation to hold data, the Super Self Refresh (SSR) technology can extend the refresh cycle to as much as approximately one second when the ambient temperature Ta is 85° C., by both arranging an ECC circuit on a semiconductor memory device and then encoding the entire chip area at the time of entry to a low-consumption power mode and implementing a correction operation of the entire chip area at the time of exit from the low-consumption power mode. The SSR technology is disclosed in, for example, Japanese Patent Laid-Open Publication No. 2002-56671 (JP, P2002-56671A).

FIG. 1A shows the configuration of a semiconductor memory device of the prior art that uses the SSR technology, and FIG. 1B gives a schematic representation of the configuration of a memory cell array that is provided with a product code parity bit area.

The two codes C1 and C2 are a (n1, k1) code and a (n2, k2) code, respectively; and k1*k2 information points are encoded as a two-dimensional arrangement of k1 rows and k2 columns by encoding k1 information points of each column by code C1 and encoding k2 information points of each row by code C2 to obtain a code word having an overall length of n1*n2. Code that is obtained by this type of encoding is linear (n1*n2, k1*k2) code and is referred to as the product code of codes C1 and C2.

As shown in FIG. 1A, the semiconductor memory device is provided with a plurality of banks 100, with a plurality of encoders/decoders 101 and a plurality of write buffer/main buffers 102 being provided for each bank 100. Encoder/decoders 101 are connected to SDRAM (Synchronous DRAM) interface 103; and SDRAM interface 103 is connected to ECC controller 104. In this case, each write buffer/main buffer 102 is provided between a corresponding encoder/decoder 101 and bank 100. The area marked by diagonal lines in FIG. 1A indicates one representative memory cell array. Bank 100 is provided with a plurality of such memory cell arrays.

Focusing next on each memory cell array, as shown in FIG. 1B, a memory cell array has 1024×1024 cells for storing information bits that are arranged two-dimensionally, a storage area of parity bits in the vertical direction (code #1), and a storage area of parity bits in the row direction (code #2), whereby product code is stored. Parity bits in the vertical direction are (1040, 1024) Hamming code, and parity bits in the row direction are (1040, 1024) Hamming code.

Explanation next regards the SSR procedure in a semiconductor memory device of this type with reference to FIG. 2.

First, entry is made to SSR in Step S1, following which the entire area of the bank is encoded in Step S2. In this encoding, cell areas that store information bits are subjected to prescribed error correction encoding, and the results of this encoding are stored in the cell areas of the information bits and in the cell areas of the parity bits, following which the bank is subjected to a refresh operation in Step S3, and determination carried out in Step S4 whether to exit SSR. If SSR is not exited at this point, the process returns to Step S3 and the refresh operation is again carried out. Alternatively, if it is determined to exit SSR in Step S4, the SSR exit process is carried out in Step S5, and all areas are encoded in Step S6. The encoding implemented in Step S6 corresponds to the correction operation.

FIG. 3 is a graph showing the improvement in the refresh cycle brought about by the use of the SSR technology. In FIG. 3, the horizontal axis shows the retention time (i.e., refresh cycle) $t_{REF}$, and the vertical axis shows the error rate (%). The rate of occurrence of defective bits is used as the error rate. In the figure, the DRAM error rate is normal DRAM error rate, i.e., the error rate of DRAM that does not employ the SSR technology.

The points indicated by the broken line in FIG. 3 show the error rate in a semiconductor memory device that employs the SSR technology. At $t_{REF}=1$ second, approximately 100 defective bits occur due to fluctuation in retention time, and an error pattern occurs in which correction by SSR is not possible. FIG. 3 shows an error rate of 1 bit (approximately $1 \times 10^{-7}$) at $t_{REF}=0.1$ seconds and below.

FIG. 4 shows the state of occurrence of defective bits in DRAM due to fluctuation of the retention time $t_{REF}$ in the semiconductor memory device that employs SSR technology. In FIG. 4, the horizontal axis represents time, and the vertical axis represents the error rate (%). When $t_{REF}$ is equal to or greater than 0.1 second, the DRAM error rate rises, and results in drastic further occurrence of additional errors after shipment.

Essentially, a semiconductor memory device must be developed in which the error rate does not increase when $t_{REF}$ is equal to or greater than 0.1 second, and in which the occurrence of additional errors following shipment is suppressed.

FIG. 5 is a flow chart for explaining the process of the prior art for remedying defective cells in a semiconductor memory device that employs the SSR technology.

First, in Step S11, writing to all bits is carried out in the pattern "ALL Physical 1" i.e., a pattern of values in which the logical value is "1" when the cells are read. After writing, encoding which uses the product code is carried out in Step S12, following which refresh operation is repeated at a cycle of 1 second in Step S13.

Next, in Step S14, data are read from the memory cell array and decoded, and in Step S15, a pass/fail determination is carried out for the data that have been read to generate fail information. The fail bits are then remedied by replacement by means of redundant cells.

FIG. 6 is a view for explaining the correction operation by product code. Here, a case is explained in which a correction operation by means of ECC that uses product code enables fail bits to be saved without implementing replacement by redundant cells. FIG. 6 shows a memory cell array that contains fail bits. In the figure, "x" indicates a fail address or a fail cell. In addition, a plot of the arrangement of fail cells or fail bits in a memory cell array is referred to as a "fail map."

Cell array 306A that includes fail cells is subjected to single-bit error correction by code #1. Because 2 or more points of fail bits per column cannot be corrected at this time, fail map 306B is obtained as the cell array data following correction. The memory cell array shown in this fail map 306B is subjected to single-bit error correction by code #2. As shown in FIG. 6, error correction by means of product code results in PASS by correction by means of code #2 and remedying by redundancy is not necessary. In other words, it is possible to carry out error correction of the defective cells of each row by error correction by means of code #2, whereby remedying by redundant cells becomes unnecessary.

In contrast, FIG. 7 gives a schematic representation of the operations for a case in which error correction by ECC is not possible and replacement by redundant cells, i.e., the redundancy remedy of the prior art, becomes necessary.

Cell array 307A that includes fail cells is subjected to the single-bit error correction by means of code #1 as described hereinabove to obtain the fail map 307B, and then memory cell array that is shown in fail map 307B is subjected to single-bit error correction by means of code #2. Since correction is not possible for cases of two fail bits per row, fail bits (defective cells) in fail map 307C in this case become the object of remedy by means of redundant cells.

When the defect remedy method of the prior art is used, however, defective bits occur due to fluctuation in retention time following shipment of the DRAM product as shown by "additional errors following shipment" in FIG. 4, and these additional error bits cause a drastic increase, for example, in the order of ten, in the market defective rate, i.e., the defective rate following shipment.

FIG. 8 gives a schematic representation of both an uncorrectable pattern that can be detected in the process of wafer inspection before shipment and a pattern that was determined to be correctable in the process of wafer inspection but that becomes uncorrectable due to fluctuation in retention time that occurs after shipment. As shown in FIG. 8, memory LSI (large-scale integration) that allows correction of defective bits by product code ECC includes both a pattern of bits that are already uncorrectable and a pattern of bits that have become uncorrectable by the addition of single-bit fail bits. A cell which is correctable at the time of wafer inspection, but will become uncorrectable by addition of a single-bit fail bit is referred to as a potential defect cell.

SUMMARY OF THE INVENTION

The additional errors of DRAM products following shipment increase due to the addition of single-bit fail bits, and this problem calls for an effective countermeasure.

It is therefore an object of the present invention to provide a semiconductor device that allows error correction of a pattern of bits that are already uncorrectable and that are the objects of remedy by redundancy, and a pattern of bits that are uncorrectable due to the addition of single-bit fail bits.

It is another object of the present invention to offer a semiconductor device testing method that allows the error correction of a pattern that is already uncorrectable and that is the object of remedy by redundancy and a pattern that is uncorrectable due to the addition of one-bit fail bits.

According to a first aspect of the present invention, a semiconductor device includes: an ECC circuit that uses product code that is composed of a first code and a second code for carrying out error correction of memory; and means for causing independent operation by one code of the first code and the second code.

According to a second aspect of the present invention, a semiconductor device that is provided with an ECC circuit that uses product code that is composed of a first code and a second code for carrying out error correction of a semiconductor memory device includes: a first encoding circuit for encoding by means of the first code; a second encoding circuit for encoding by means of the second code; a first decoding circuit for decoding by means of the first code; a second decoding circuit for decoding by means of the second code; a parity generation circuit for generating parity; a syndrome operation circuit; and a control circuit. The control circuit effects control during encoding by means of one of the first code and the second code and based on control signals that are received as input such that: data of the semiconductor memory device are supplied as input to one of the first encoding circuit and the second encoding circuit; the encoded output from the encoding circuit to which the data were supplied is supplied as input to the parity generation circuit; the generated parity is written to the semiconductor memory device; data encoded by one of the first code and the second code is read from the semiconductor memory device; the data that has been read is supplied to one of the first decoding circuit and the second decoding circuit; the output of the decoding circuit to which the read data was supplied is supplied to the syndrome operation circuit and a correction operation performed; and the corrected bits are written to the semiconductor memory device.

According to a third aspect of the present invention, a method is provided for testing a semiconductor memory device or memory LSI, the method taking as its object a semiconductor memory device that is provided with an ECC circuit that uses product code that is composed of a first code and second code to perform error correction of memory. This test method includes: a step for obtaining first pass/fail determination results and second pass/fail determination results by means of correction operations realized independently based on the first code and the second code and recording these results to a first fail memory and a second fail memory, respectively; a step for executing a prescribed logical operation relating to the contents of the first fail memory and the contents of the second fail memory; and a step for, based on the results of the logical operation, remedying both fail bits and potential fail bits.

According to a fourth aspect of the present invention, a method is provided for testing a semiconductor memory device or a memory LSI, the method taking as its object a semiconductor memory device that is provided with an ECC circuit that uses product code that is composed of a first code and a second code to perform error correction of memory. This test method includes the steps of: deriving the pass/fail determination results realized by one of the first code and second code and taking a complementary pattern of the determination results as mask data; and using the mask data to derive the pass/fail determination results of the other code of the first code and second code to remedy both the fail bits and the potential fail bits.

In the present invention, a dynamic semiconductor memory device that comprises a memory cell array having a storage area of parity data that is realized by product code that is composed of a first code and a second code is tested by a test method that includes the steps of:

(A1) writing prescribed value data to the memory cell array; and as an encoding process realized by the first code, reading data from the memory cell array to generate a first parity, and writing the first parity that has been generated to the memory cell array;

(A2) following a refresh operation of a prescribed interval, reading dada encoded by the first code from the memory cell array, decoding the read data, and writing first corrected bits to the memory cell array;

(A3) reading data from the memory cell array to which the first corrected bits have been written, determining pass/fail, and recording the determination results to a first fail memory;

(A4) writing prescribed value data to a memory cell array, and, as an encoding process realized by the second code, reading data from the memory cell array to generate a second parity, and writing the second parity that has been generated to the memory cell array;

(A5) following a refresh operation of a prescribed interval, reading data encoded by the second code from the memory cell array, decoding the read data, and writing second corrected bits to the memory cell array;

(A6) reading data from the memory cell array to which the second corrected bits have been written and determining pass/fail, and recording the determination results to a second fail memory; and (A7) executing a prescribed logical operation relating to the contents of the first fail memory and the contents of the second fail memory, and based on the results of the logic operation, deriving cells that are remedied by means of redundant cells.

Alternatively, in the present invention, a dynamic semiconductor memory device that comprises a memory cell array having a storage area of parity data that is realized by product code composed of a first code and a second code is tested by a test method that includes the steps of:

(B1) writing prescribed value data to the memory cell array; and as an encoding process realized by the first code, reading data from the memory cell array to generate a first parity, and writing the first parity that has been generated to the memory cell array;

(B2) following a refresh operation of a prescribed interval, reading data encoded by the first code from the memory cell array, decoding the read data, and writing first corrected bits to the memory cell array;

(B3) reading data from the memory cell array to which the first corrected bits have been written, determining pass/fail, and producing a complementary pattern of the determination results as mask data;

(B4) writing prescribed value data to the memory cell array, and, as an encoding process realized by the second code, reading data from the memory cell array to generate a second parity, and writing the second parity that has been generated to the memory cell array;

(B5) following a refresh operation of a prescribed interval, reading data encoded by the second code from the memory cell array, decoding the read data, and writing second corrected bits to the memory cell array; and (B6) reading data from the memory cell array to which the second corrected bits have been written and determining pass/fail, masking the determination results by the mask data to produce fail information, and, based on the fail information, deriving cells that are to be remedied by means of redundant cells.

The present invention therefore enables the determination of a pattern that is already uncorrectable, and, a pattern that becomes uncorrectable due to, for example, the addition of single-bit fail bits, and consequently, enables the remedying of potential defective cells in an examination process such as a wafer inspection.

The above and other objects, features, and advantages of the present invention will become apparent from the following description with reference to the accompanying drawings, which illustrate examples of the present invention.

BRIEF DESCRIPTION OF THE DRAWINGS

FIG. 10A is a view for explaining a wafer inspection of the prior art that is applied to an SDRAM;

FIG. 10B is a view for explaining a wafer inspection in which the present invention is applied;

DETAILED DESCRIPTION OF THE PREFERRED EMBODIMENTS

Figure 5:
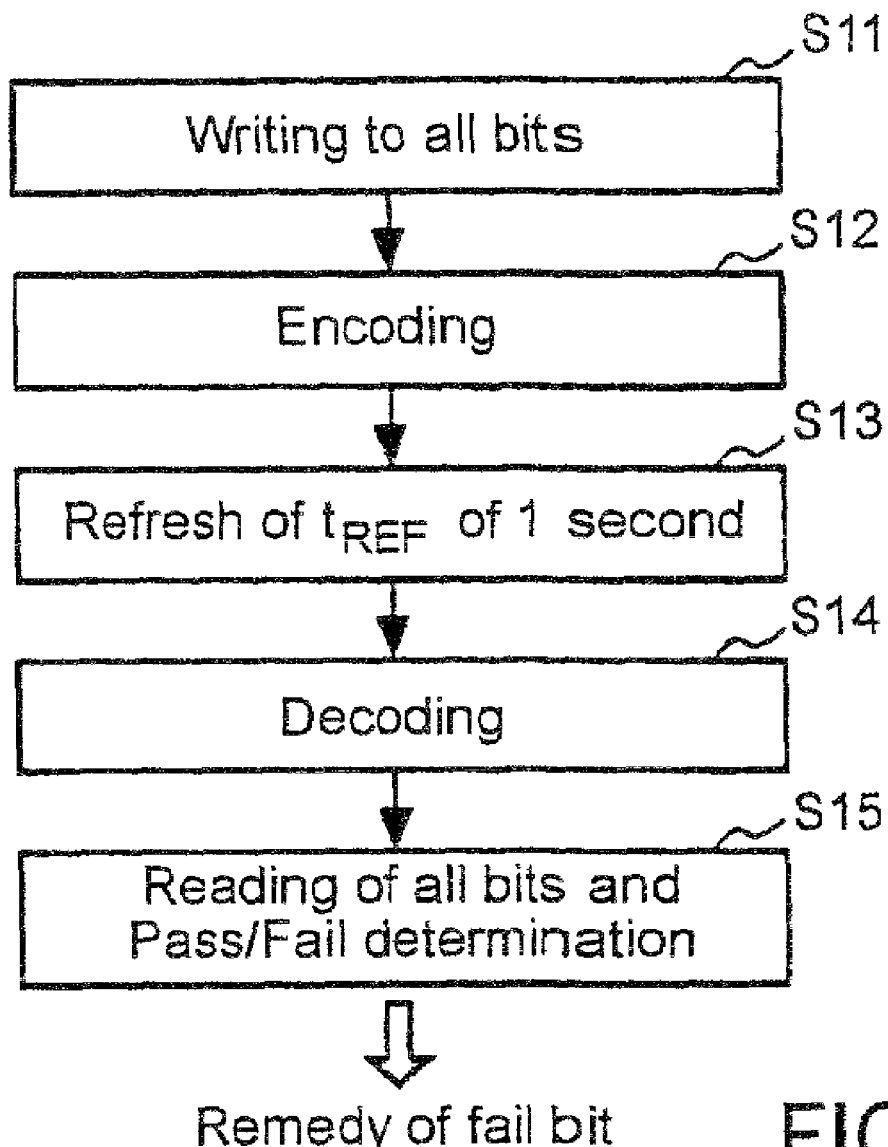
FIG. 5 is a flow chart showing an example of the procedures for remedying defective cells in the semiconductor memory device that uses the SSR technology.
Figure 6:
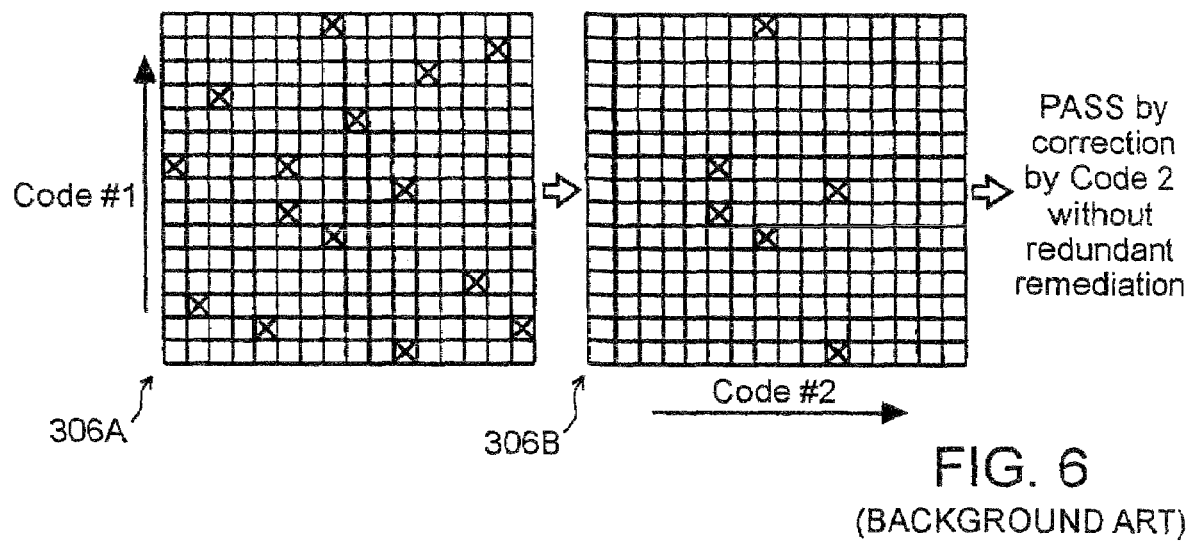
FIG. 6 is an explanatory view of the correction operation by product code.
Figure 7:
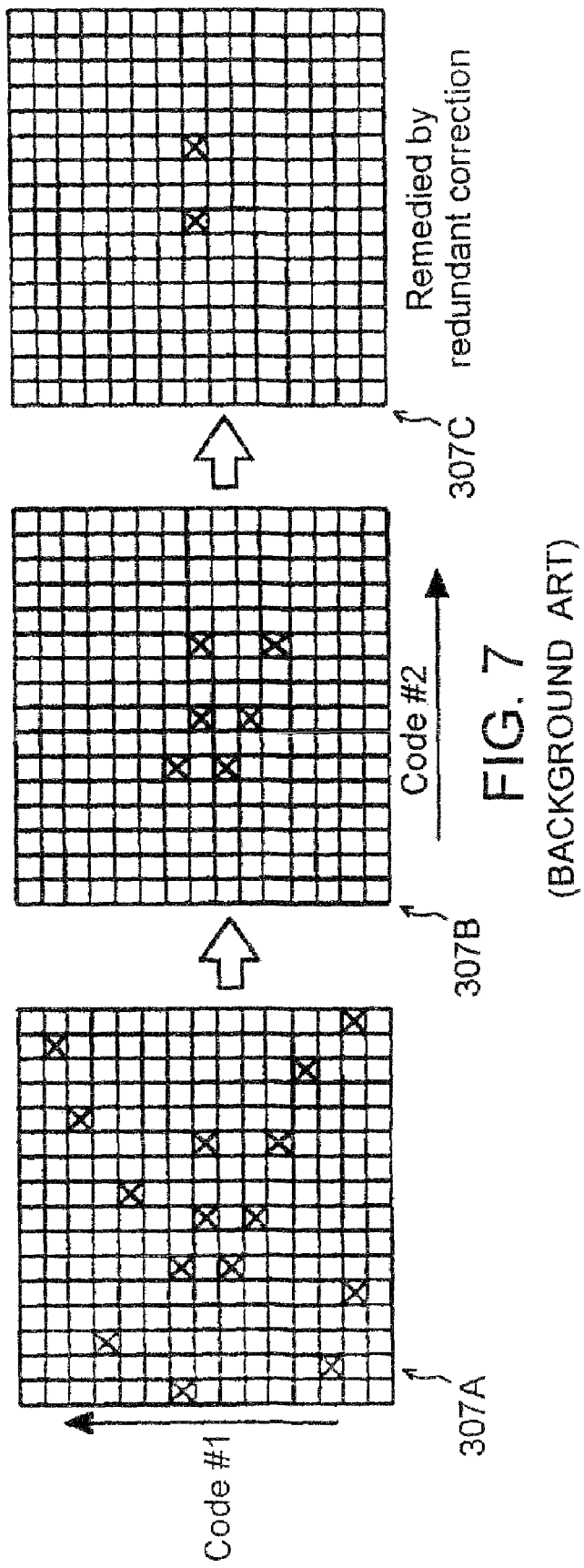
FIG. 7 is an explanatory view of the derivation of fail bits that require remedying by redundant cells.
Figure 9:
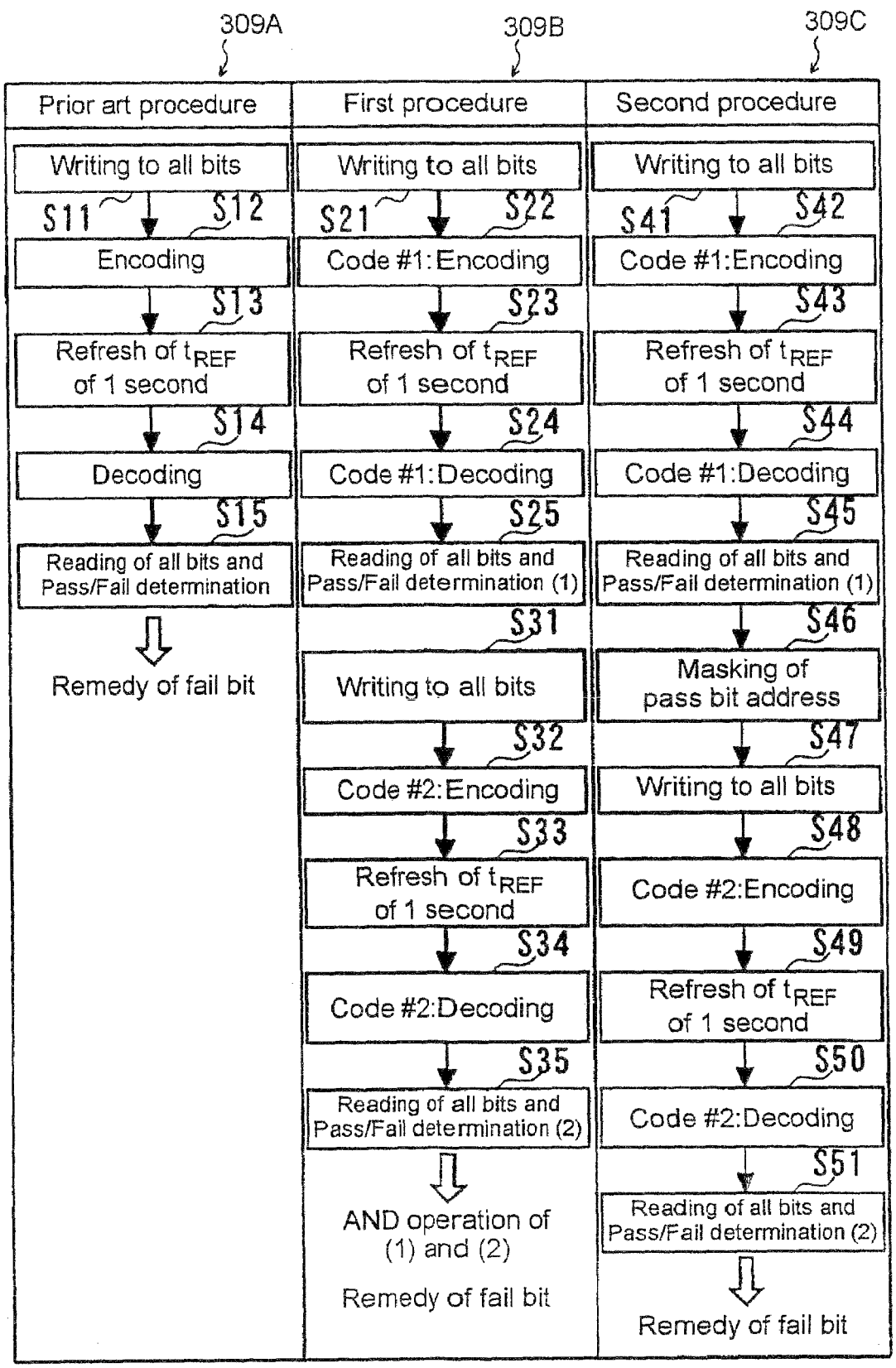
FIG. 9 is a view for explaining and comparing the procedures according to an embodiment of the present invention with the procedure of the prior art.

FIG. 9 shows the procedures for remedying defective cells according to an embodiment of the present invention in comparison with the procedure of the prior art. In FIG. 9, flow 309A shows the procedure of the prior art that is shown in FIG. 5 without alteration, flow 309B shows the first procedure based on the present invention, and flow 309C shows the second procedure based on the present invention.

In the first procedure, as shown in flow 309B, all bits are first written at a prescribed value (ALL 1) in Step S21; and then encoded by means of only code #1 in Step S22. A refresh operation is then carried out at a refresh cycle of $t_{REF}=1$ second in Step S23.

Next, in Step S24, all bits are read from the memory cell array and decoded by code #1, and pass/fail of the data is determined in Step S25. The addresses of fail bits that are obtained from the results are recorded in the first fail memory (Fail Memory #1) that is installed in memory tester (not shown).

Next, similar operations are carried out for code #2 as shown in Steps S31 to S35, and the addresses of the fail bits that are obtained as a result are recorded in the second fail memory (Fail Memory #2) that is installed in the memory tester (not shown). Specifically, all bits are written as "ALL 1" in Step S31, encoding carried out using only code #2 in Step S32, and refresh operation then repeated at a refresh cycle of $t_{REF}$=1 second in Step S33. Next, data are read and decoded in Step S34, and in Step S35, pass/fail is determined for the data, and the addresses of the fail bits are recorded in the second fail memory.

An AND (logical product) operation of the first fail memory and the second fail memory is next carried out in the memory tester, whereby the addresses of cells that are to be remedied by redundancy are found.

In the second procedure, as shown in flow 309C, all bits are first written at a prescribed value (ALL 1) in Step S41, and in Step S42, encoding is performed by means of only code #1. Then, in Step S43, a refresh operation is repeated at a refresh cycle of $t_{REF}$=1 second. All bits are next read from the memory cell array and decoded by means of code #1 in Step S44, following which pass/fail of the data is determined in Step S45. In Step S46, the addresses of bits that did not fail, i.e., pass bits, are recorded in the first fail memory of a memory tester (not shown).

Next, all bits are again written as "ALL 1" in Step S47, following which encoding by only code #2 is carried out in Step S48, and refresh operation is repeated at $t_{REF}$=1 second in Step S49. All bits are next read from the memory cell array and decoded by code #2 in Step S50, following which the pass/fail of the data is determined in Step S51. The results of this pass/fail determination are next masked by the content that is stored in the first fail memory and the addresses of fail bits that were not masked then recorded. Then, based on the recorded addresses, the fail bits may be replaced by redundant bits to remedy defects.

To execute the above procedures of this embodiment, the following modifications can be added in the process of a normal wafer inspection when fabricating the semiconductor memory device.

FIG. 10A shows the process of a normal wafer inspection of an SDRAM (Synchronous DRAM). In a normal wafer test, word-line defects and bit-line defects are remedied and then bit defects and refresh defects are remedied. In contrast, to execute the procedure of the present embodiment, the ECC test in the wafer inspection is executed independently for each of code #1 and code #2, as shown in FIG. 10B.

Explanation next regards an ECC circuit for carrying out this type of ECC test.

Figure 1B:
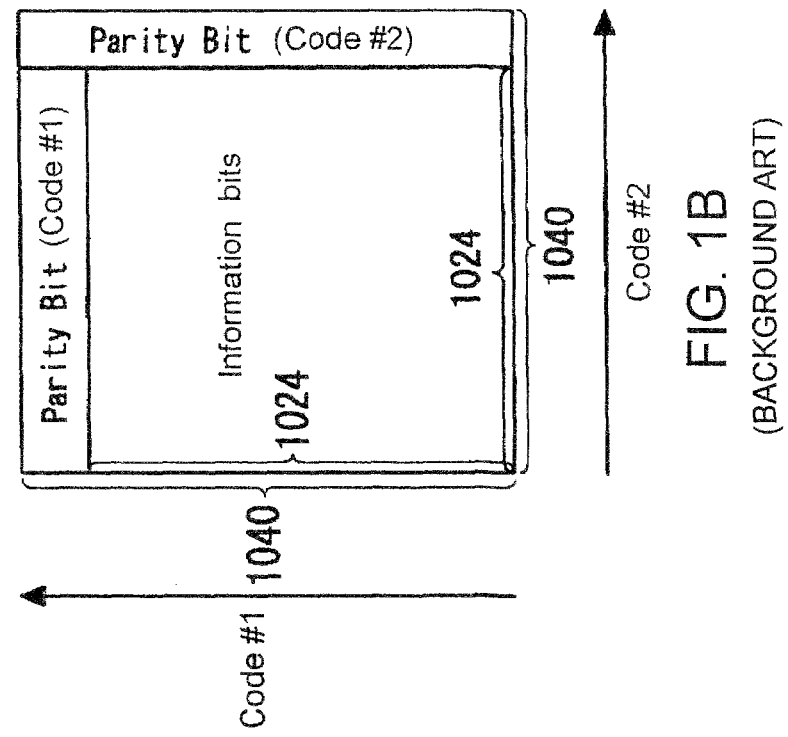
FIG. 1B is a schematic view of the configuration of a memory cell array that is provided with a parity bit area of product code.
Figure 1A:
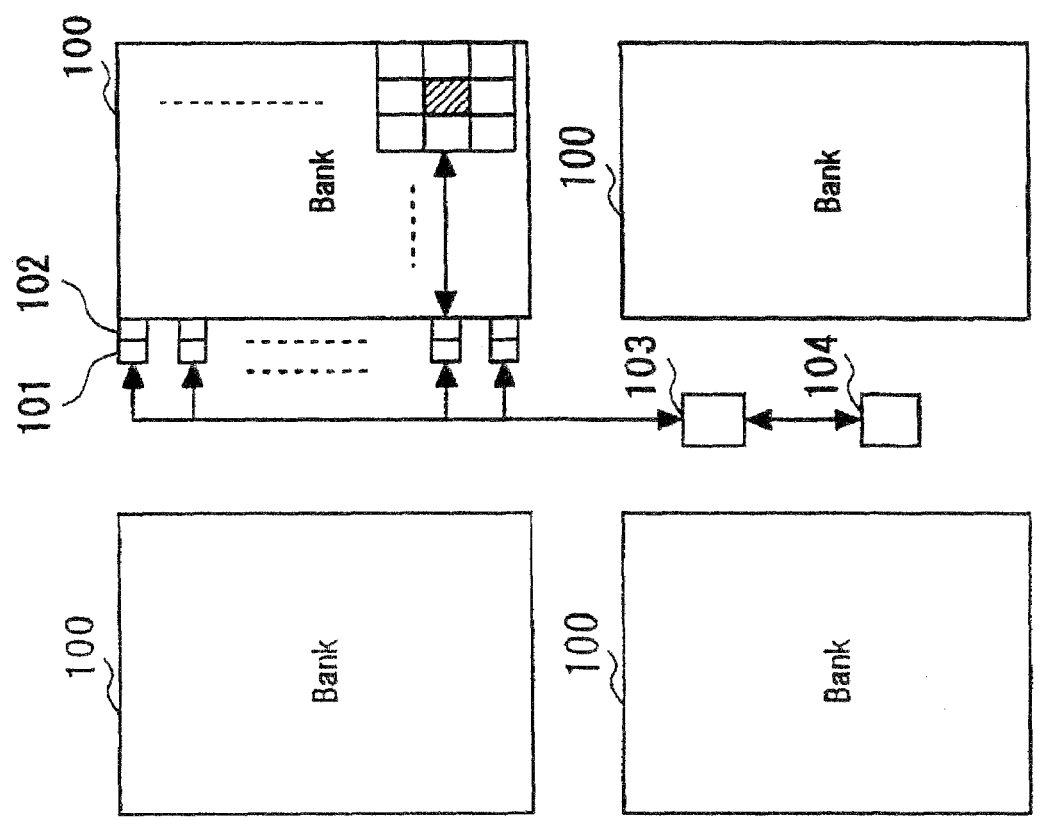
FIG. 1A shows the configuration of a conventional semiconductor memory device that uses the SSR technology.
Figure 2:
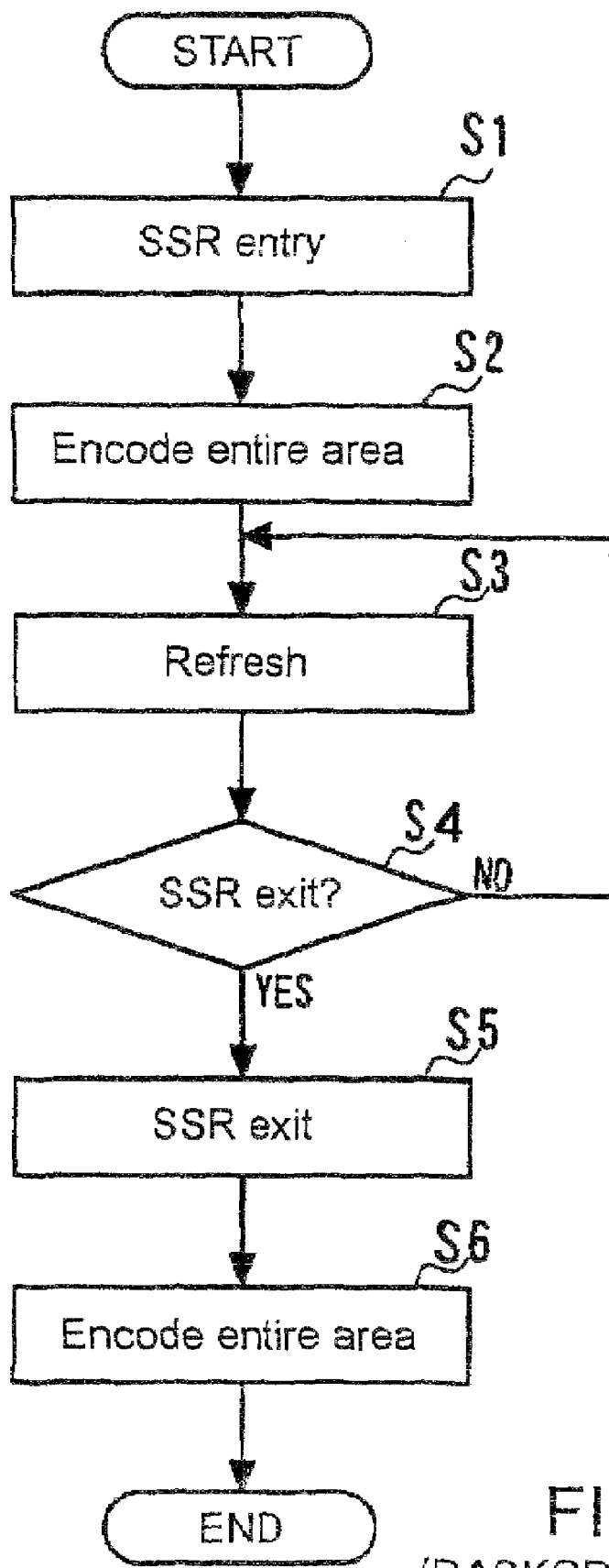
FIG. 2 is a flow chart showing procedures according to the SSR technology.
Figure 3:
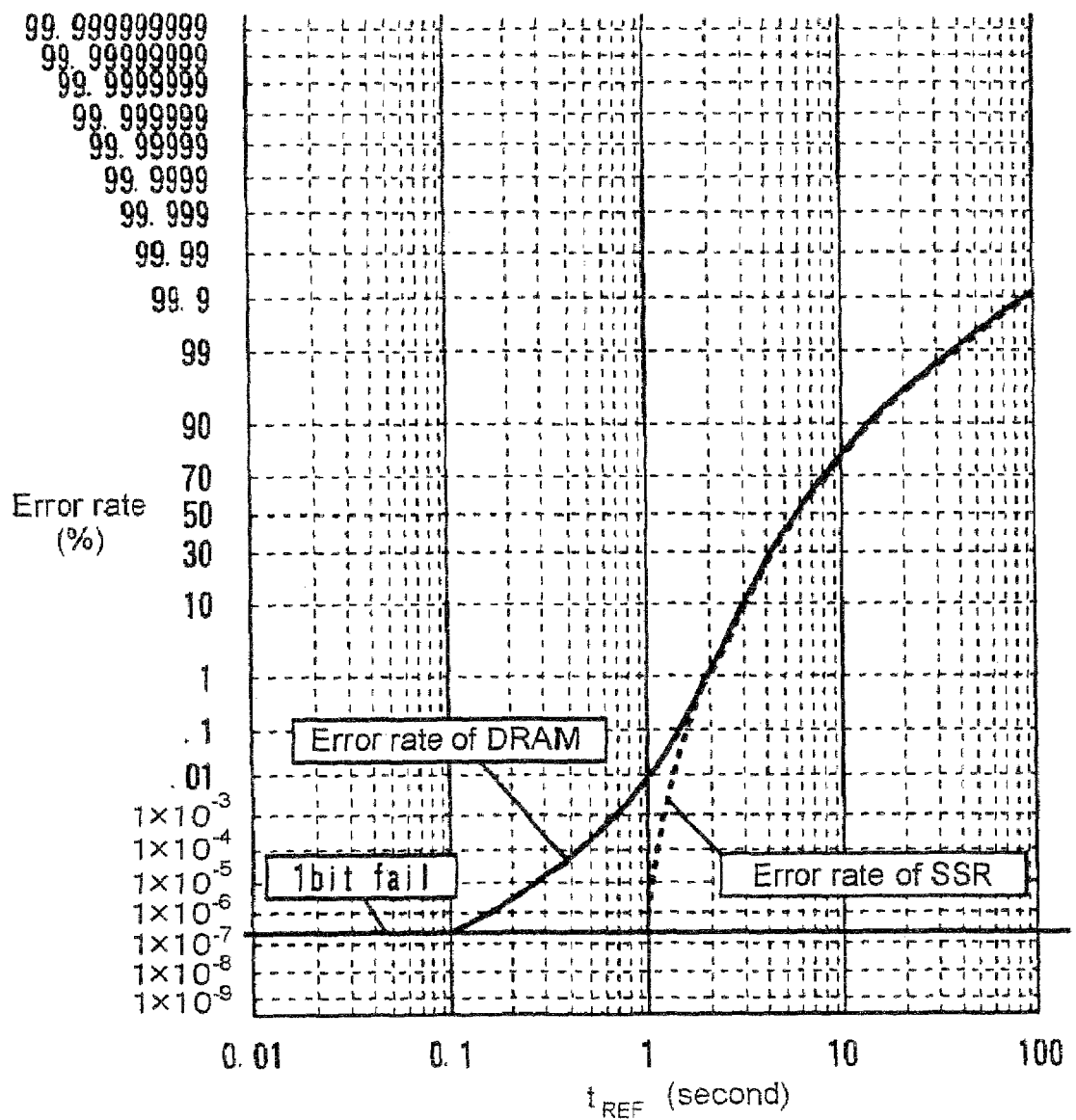
FIG. 3 is a graph showing the relation between retention time $t_{REF}$ and error rate.
Figure 4:
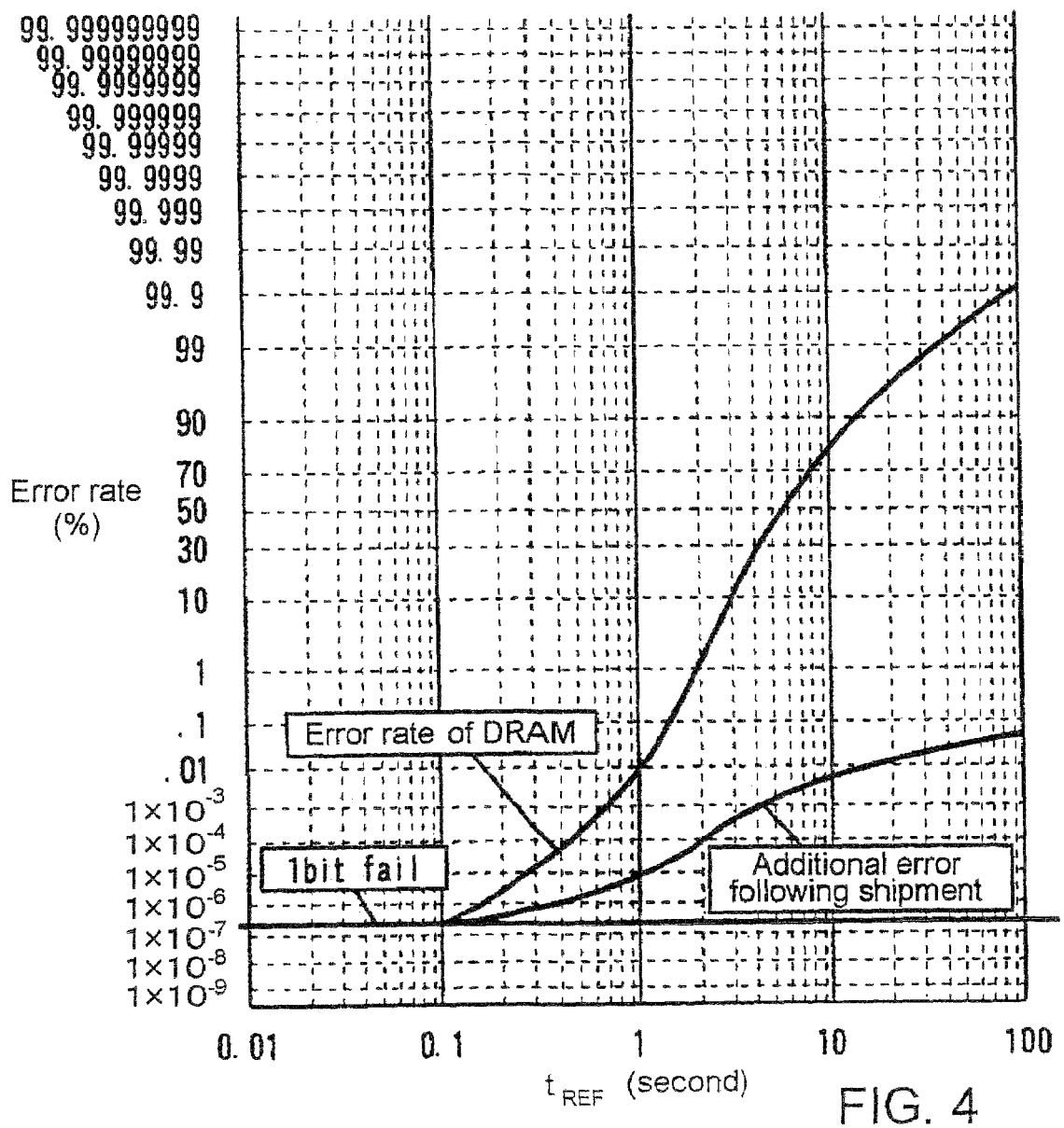
FIG. 4 is a graph showing the relation between fluctuation of retention time and error rate.
Figure 11:
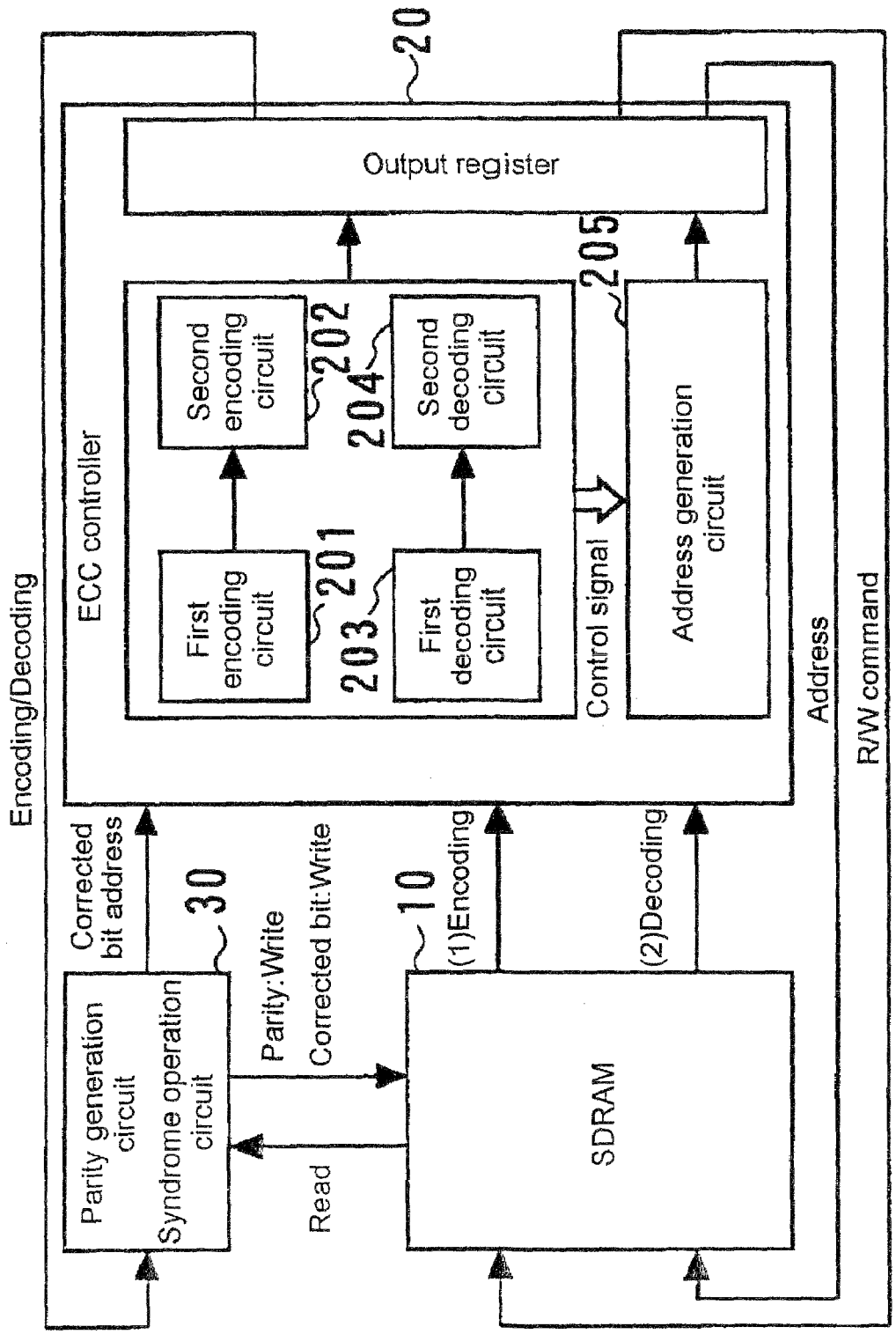
FIG. 11 is a block diagram showing the configuration of a product code ECC circuit of the prior art.

FIG. 11 is a block diagram showing the configuration of a product code ECC circuit of the prior art. ECC controller 20 and parity generation/syndrome operation circuit 30 are connected to SDRAM 10 that is the object of examination. ECC controller 20 corresponds to ECC controller 104 in the circuit that is shown in FIG. 1A. Inside ECC controller 20 are provided: first encoding circuit 201 for encoding by code #1; second encoding circuit 202 for encoding by code #2; first decoding circuit 203 for decoding by code #1, second decoding circuit 204 for decoding by code #2, address generation circuit 205, and output register 206.

Figure 12A:
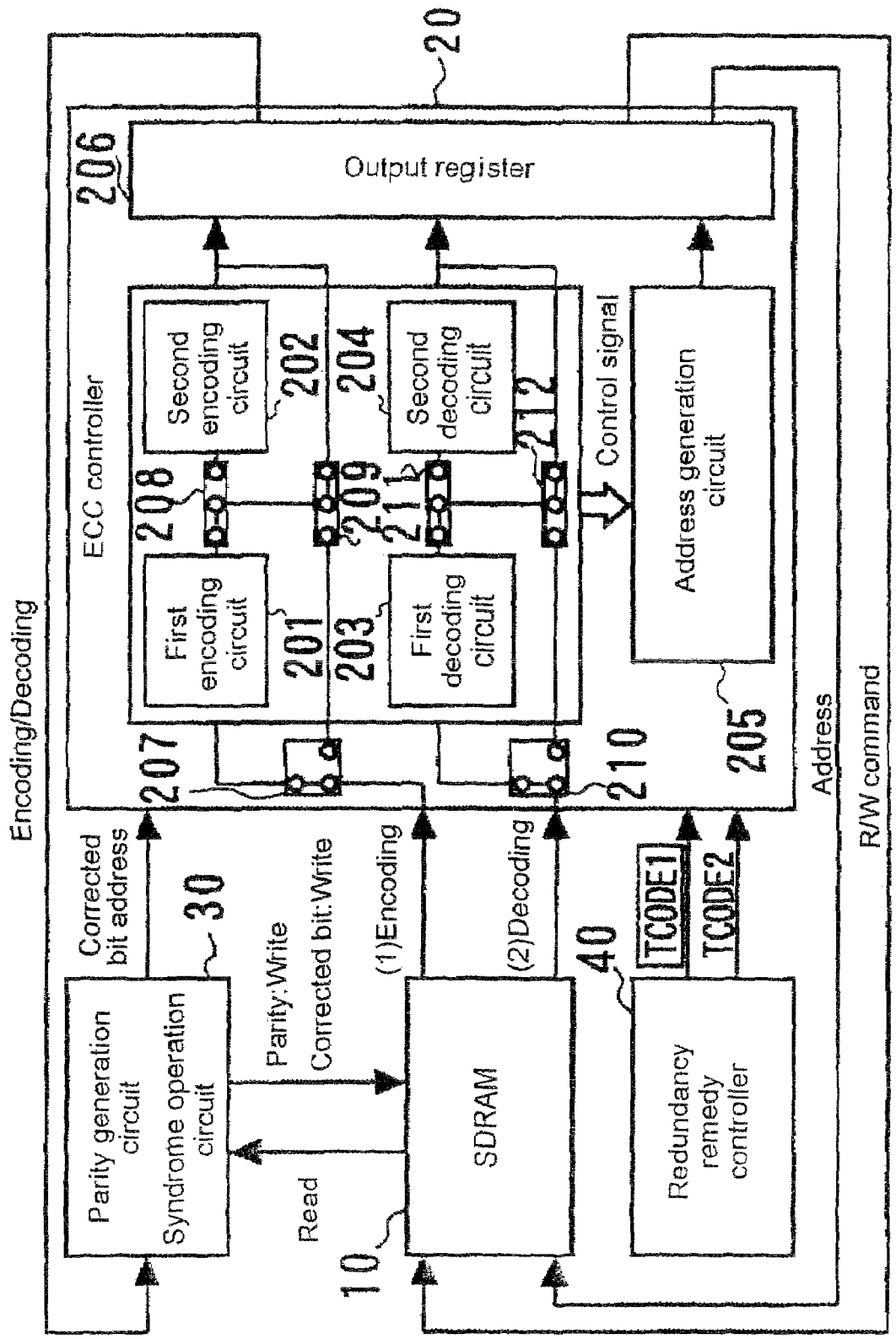
FIGS. 12A and 12B are block diagrams for explaining an ECC circuit of an embodiment of the present invention.

In contrast, the ECC circuit according to the present embodiment, as shown in FIG. 12A, is the configuration that is shown in FIG. 11 that has been modified to allow independent error correction by means of only code #1 and error correction by means of only code #2. As a result, the ECC circuit that is shown in FIG. 12A is a configuration in which redundancy remedy controller 40 is provided to the circuit that is shown in FIG. 11, and further, in which switches 207 to 212 are provided in ECC controller 20.

In the ECC circuit that is shown in FIG. 12A, control signal TCODE1 that is supplied as input from redundancy remedy controller 40 to ECC controller 20 is a control signal for implementing switch control for causing only first encoding circuit 201 and first decoding circuit 203 to operate; and TCODE2 is a control signal for implementing switch control for causing only second encoding circuit 202 and second decoding circuit 204 to operate. These control signals control switches 207 to 212.

Address generation circuit 205 generates read/write access commands, write addresses (including addresses to which parity and corrected bits are written), and read addresses. Commands or addresses that have been generated by address generation circuit 205 are supplied by way of output register 206 to SDRAM 10 as read/write (R/W) commands and address signals.

In the configuration that is shown in FIG. 12A, control signal TCODE1 that is supplied from redundancy remedy controller 40 is activated, and switches 207 to 212 are set to a configuration for operating only first encoding circuit 201 and first decoding circuit 203. In other words, the read data of SDRAM 10 are supplied by way of switch 207 to first encoding circuit 201, and the output of first encoding circuit 201 is supplied by way of switches 208 and 209 from output register 206 to parity generation/syndrome operation circuit 30. The read data of SDRAM 10 are also supplied by way of switch 210 to decoding circuit 203, and the output of first decoding circuit 203 is supplied by way of switches 211 and 212 from output register 206 to parity generation/syndrome operation circuit 30.

Figure 12B:
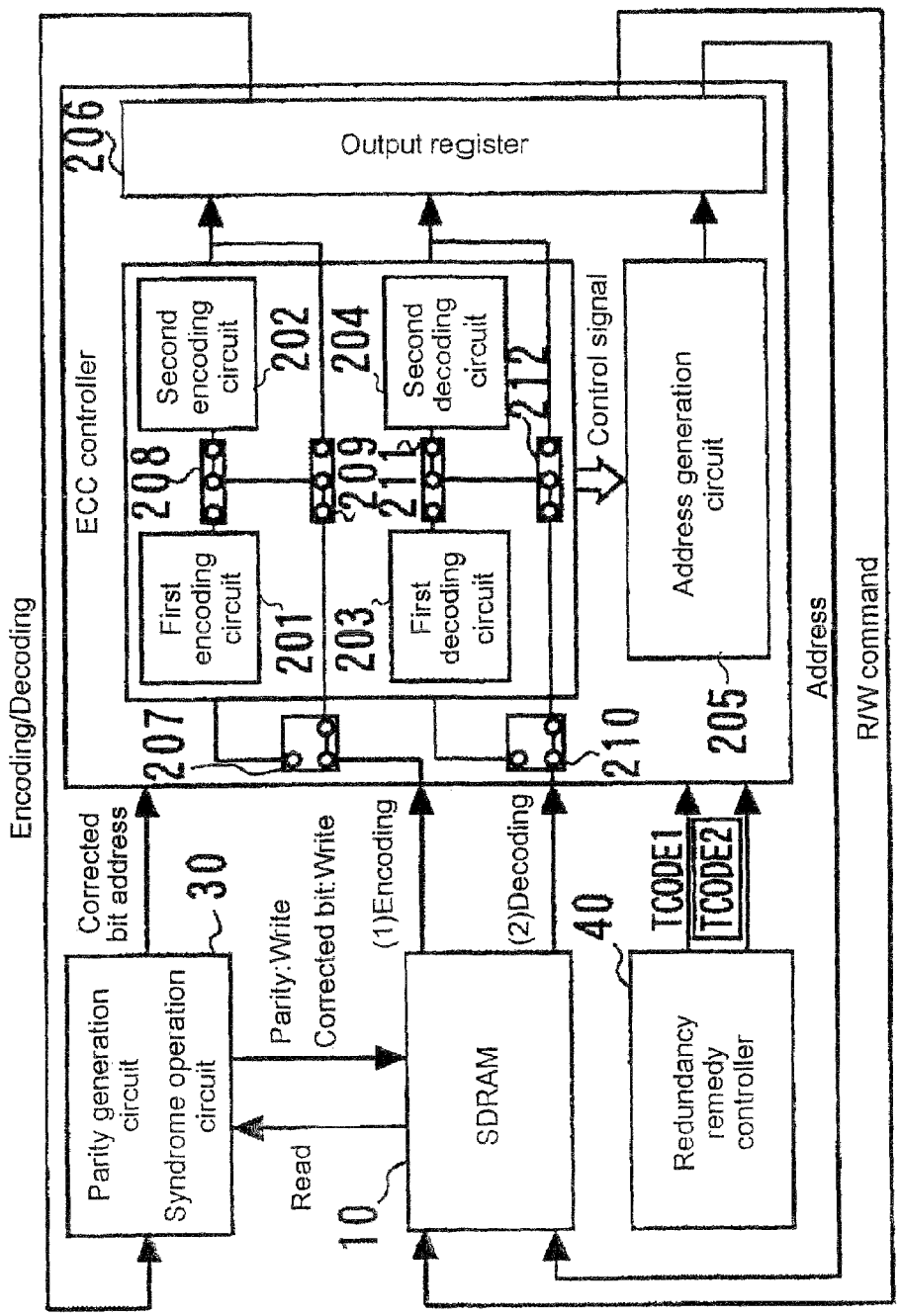

FIG. 12B shows the switching state of switches 207 to 212 when control signal TCODE2 that has been supplied from redundancy remedy controller 40 has been activated. When control signal TCODE2 has been activated, switches 207 to 212 are set to a configuration for operating only second encoding circuit 202 and second decoding circuit 204. In other words, the read data of SDRAM 10 are supplied by way of switches 207, 209, and 208 to second encoding circuit 202, and the output of second decoding circuit 202 is supplied from output register 206 to parity generation/syndrome operation circuit 30. The read data of SDRAM 10 are also supplied by way of switches 210, 212, and 211 to second decoding circuit 204, and the output of second decoding circuit 204 is supplied from the output register 206 to parity generation/syndrome operation circuit 30.

Figure 13:
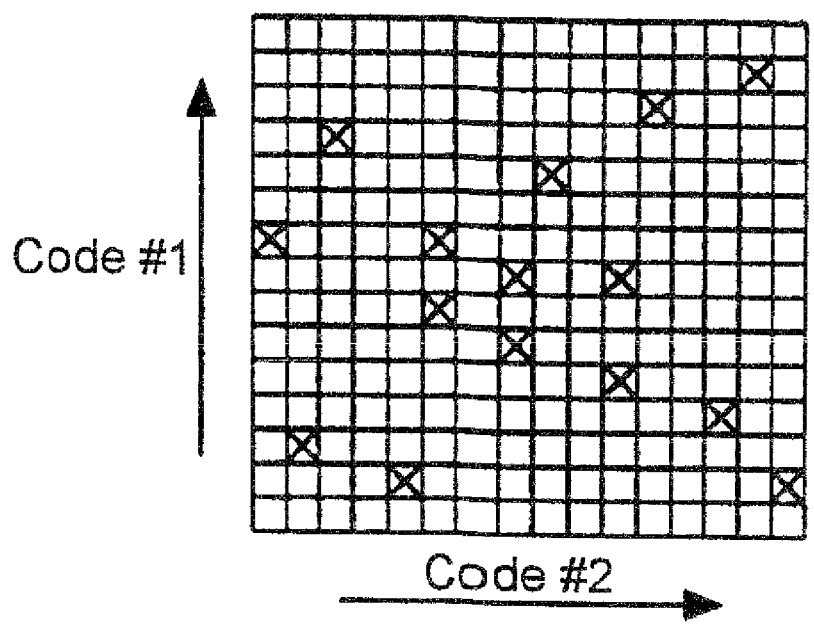
FIG. 13 shows an example of fail bits.
Figure 14:
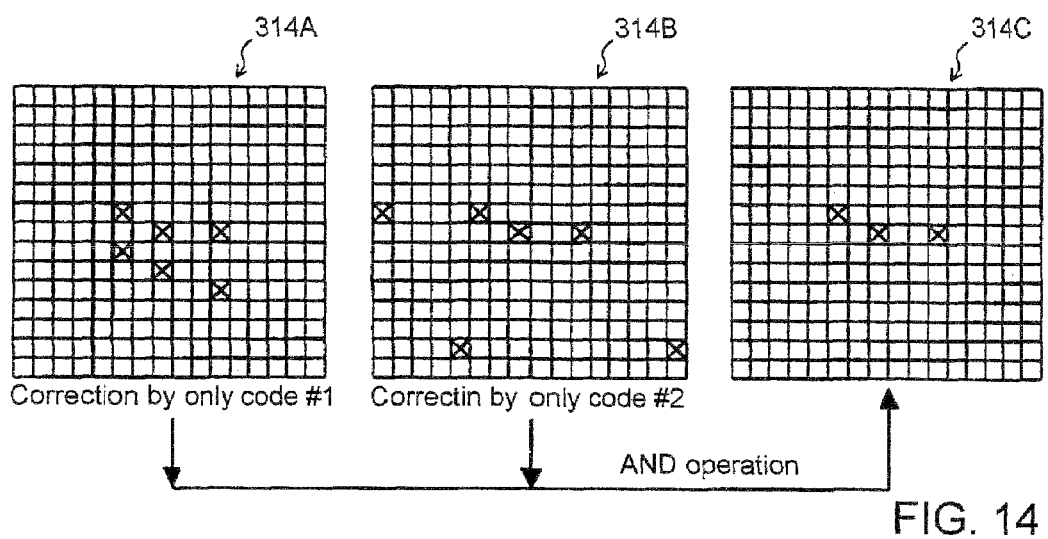
FIG. 14 is a view for explaining the first procedure.

If the memory cell array in which fail bits are arranged as shown in FIG. 13 is subjected to the process of the first procedure that is shown as flow 309B in FIG. 9 using the circuit that is shown in FIGS. 12A and 12B, a result is obtained that is displayed by the fail map that is shown in FIG. 14. In other words, if the memory cell array in which fail bits are arranged as shown in FIG. 13 is subjected to correction by means of only code #1, the result that is shown by fail map 314A is obtained, and this result is recorded in the first fail memory. Similarly, if the memory cell array in which fail bits are arranged as shown in FIG. 13 is subjected to correction by only code #2, the result that is shown in fail map 314B is obtained, and this result is recorded in the second fail memory. Carrying out a process for finding the logical product (AND) of the content of the first fail memory and the content of the second fail memory obtains the result that is shown as fail map 314C. The bits that are still shown as fail bits in fail map 314C are defective bits that are not remedied by the ECC process, and these bits are remedied by replacement by redundant bits.

Figure 15:
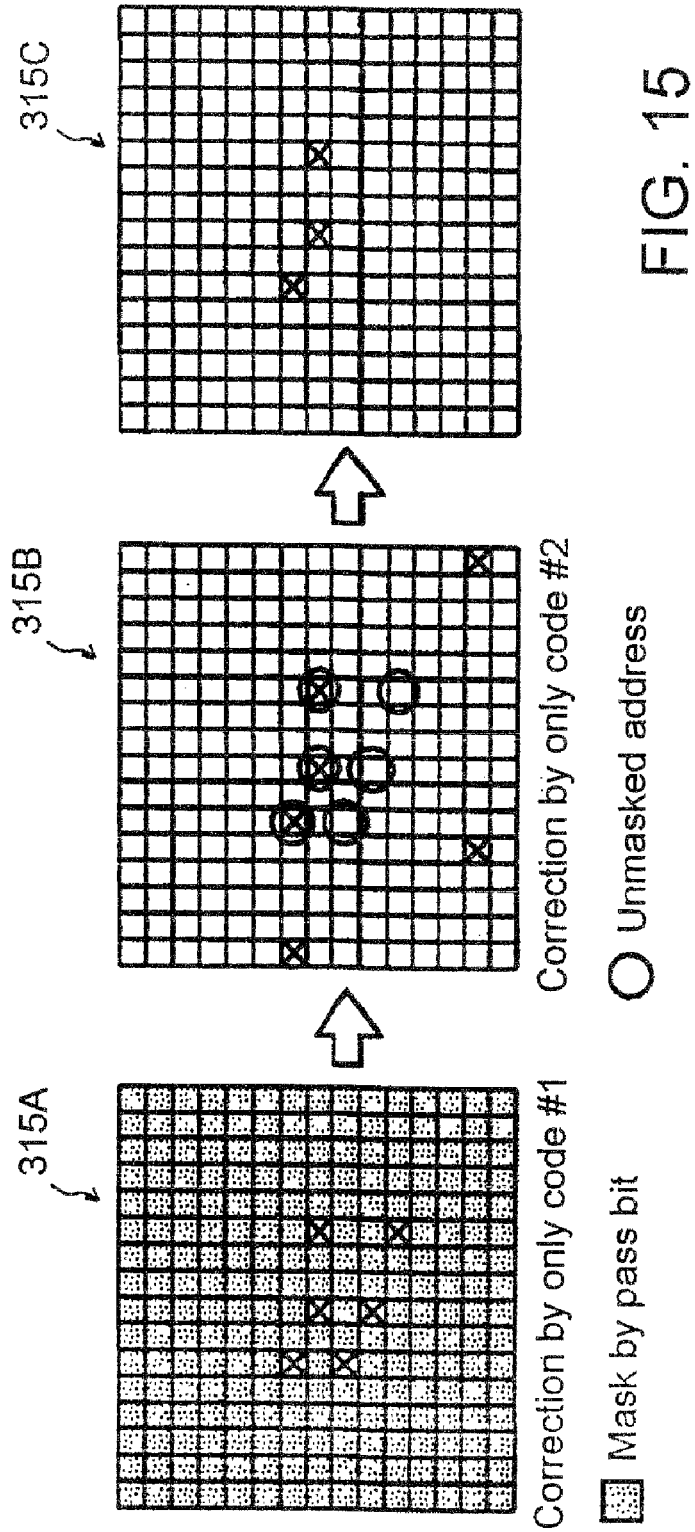
FIG. 15 is a view for explaining the second procedure.

Similarly, If a memory cell array in which fail bits are arranged as shown in FIG. 13 is subjected to the process of the second procedure that is shown as flow 309C in FIG. 9 using the circuit that is shown in FIGS. 12A and 12B, the results that are shown by the fail map shown in FIG. 15 are obtained. In other words, if the memory cell array in which fail bits are arranged as shown in FIG. 13 is subjected to correction by only code #1, the results that are shown by fail map 314A in FIG. 14 are obtained, and if these result are subjected to the process of masking pass bit addresses, address mask 315A that is shown in FIG. 15 is obtained. If the memory cell array in which fail bits are arranged as shown in FIG. 13 is subjected to correction by only code #2 and the pass/fail of the data then determined, the results shown in fail map 315B are obtained. Then, masking fail map 315B by address mask 315A and focusing only on addresses that are not masked yields the results that are shown as fail map 315C. Bits that are still shown as fail bits in fail map 315C are defective bits that have not been remedied by the ECC process, and the addresses of these fail bits are therefore recorded and the bits remedied by replacement with redundant bits.

Explanation next regards the details of the first procedure. Explanation first regards the process of encoding and decoding by code #1 with reference to the flow chart of FIG. 16.

First, in Step S101, all bits in the memory cell array are written at a prescribed value (ALL 1), following which an encoding process is carried out by means of only code #1. In the encoding process by code #1, data are read by columns from the memory cell array in Step S102, parity is generated based on code #1 in Step S103, and the parity is written to the parity bit area in Step S104. This operation is repeated, for example, 262,144 ($=2^{18}$) times, i.e, 256 k times, to cover the entire area of the SDRAM memory chip, as shown in FIG. 105.

After the encoding process by code #1 has been completed, a refresh operation at a refresh cycle of $t_{REF}=1$ second is repeated in Step S106, following which a decoding process by code #1 is carried out. In the process of decoding by code #1, data are read by columns from the memory cell array in Step S107, a correction operation is carried out based on the data that have been read by column in Step S108, and the corrected bits are written to the memory cell array in Step S109. As shown in Step S110, this type of operation is repeated, for example, 262,144 times for all bits of the SDRAM.

Following the process of decoding by code #1, pass/fail is next determined in Step S111, and the addresses of fail bits are recorded to the first fail memory of the memory tester.

Figure 16:
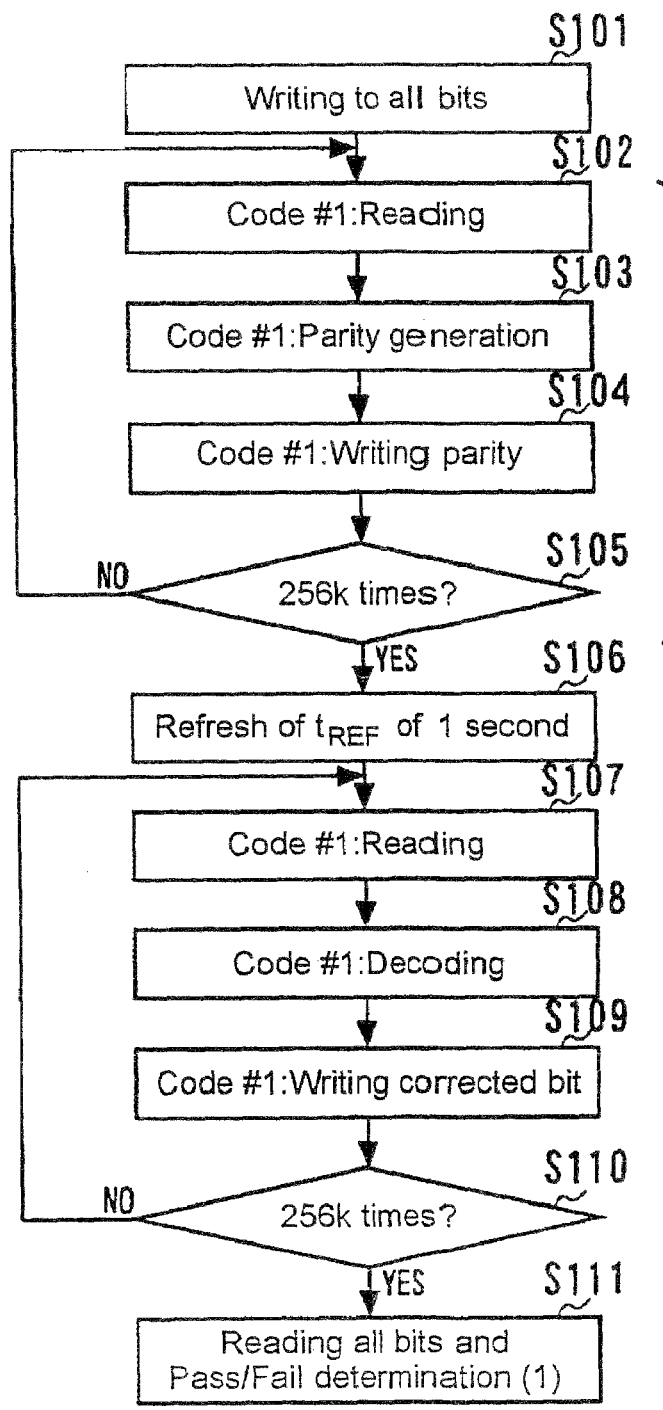
FIG. 16 is a flow chart showing the correction operation by code #1 in the first procedure.
Figure 17A:
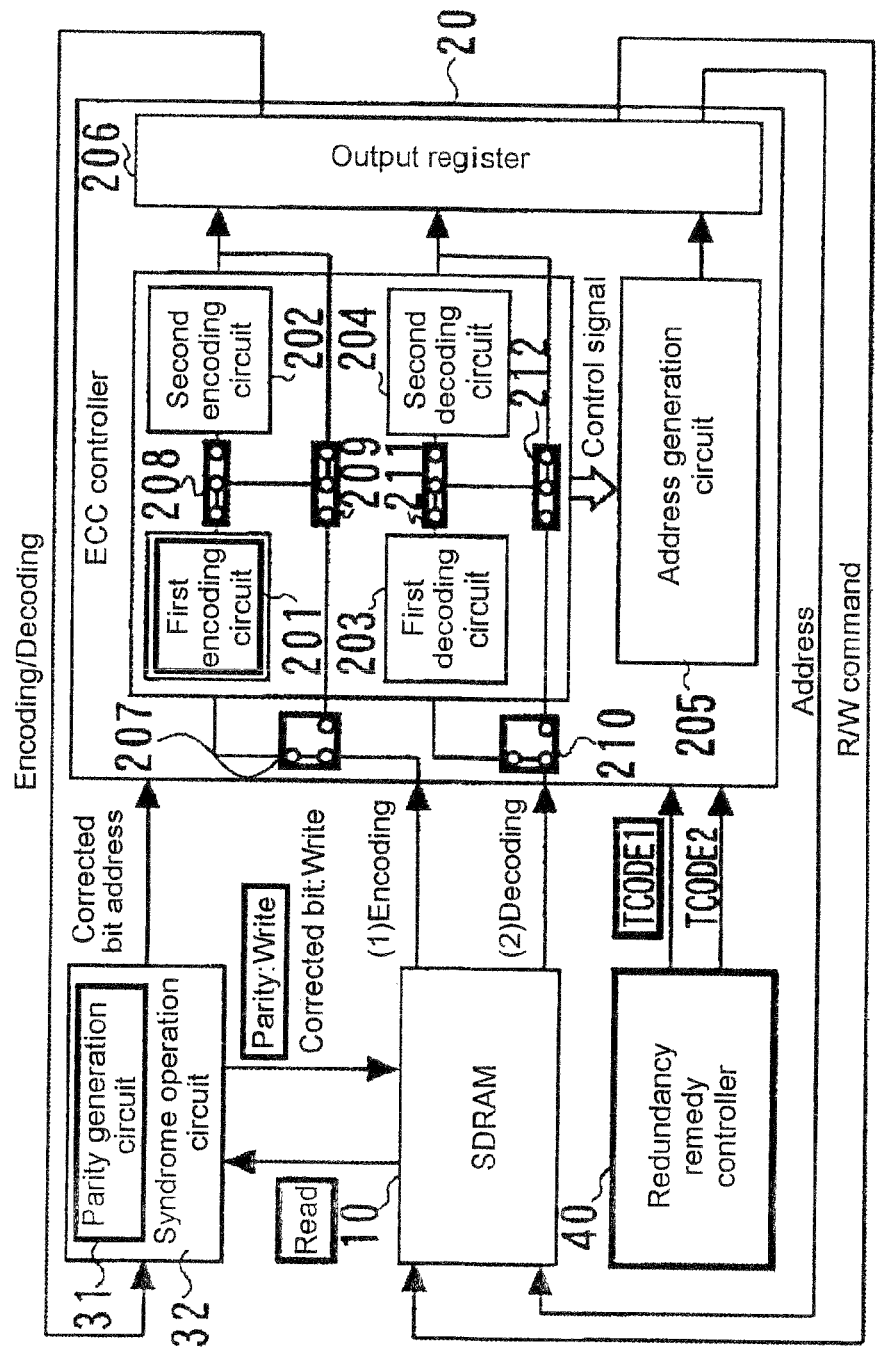
FIGS. 17A and 17B are block diagrams showing the circuit configuration for the correction operation by means of code #1 in the first procedure.
Figure 17B:
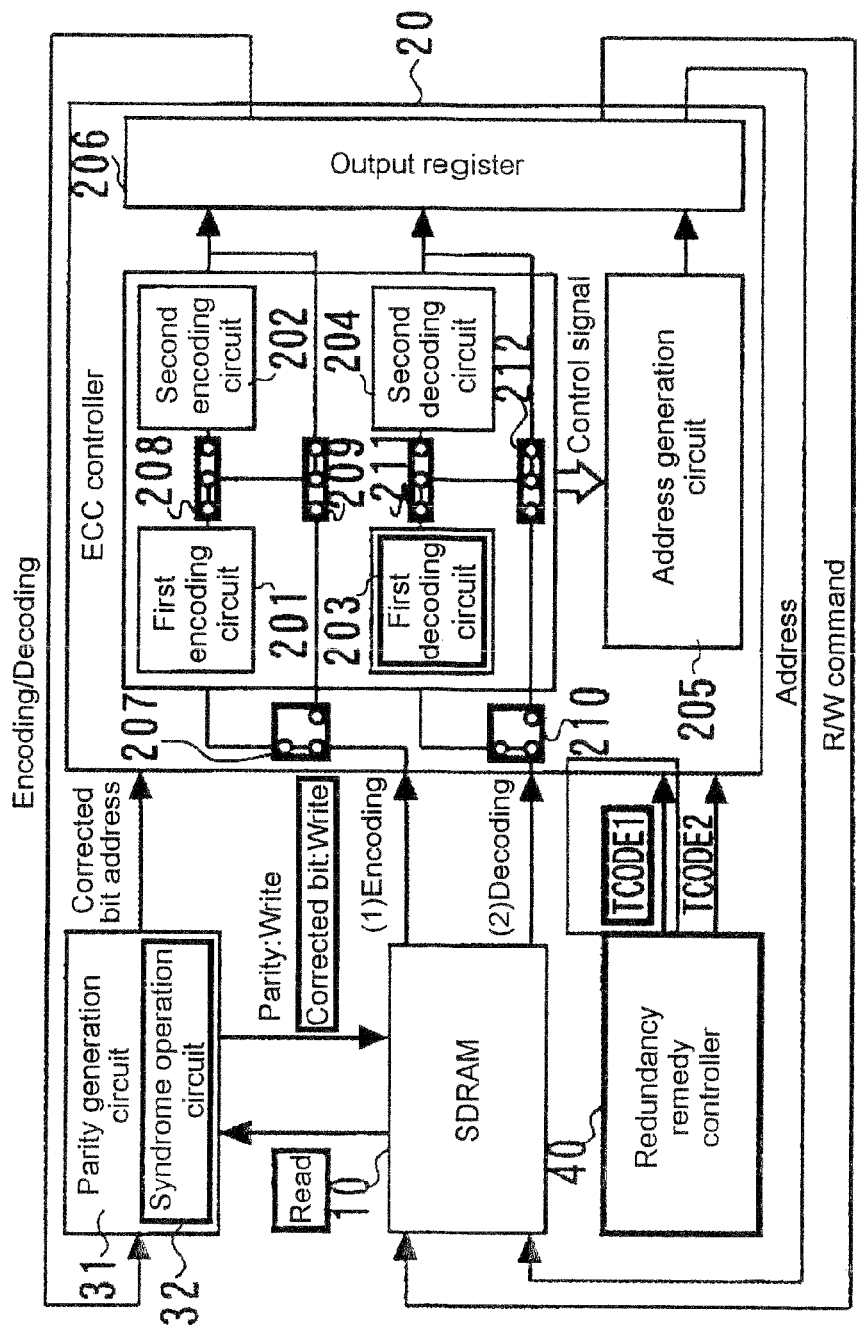

FIGS. 17A and 17B are figures for explaining the operations (see FIG. 16) in the ECC circuit that is shown in FIGS. 12A and 12B. Parity generation/syndrome operation circuit 30 is provided with parity generation circuit 31 and syndrome operation circuit 32. It is here assumed that control signal TCODE1 from redundancy remedy controller 40 is activated. As shown in FIG. 17A, the data that are stored in SDRAM 10 are supplied as input to first encoding circuit 201, the output from first encoding circuit 201 is supplied from output register 206 to parity generation circuit 31, and the parity that is generated by parity generation circuit 31 is written to SDRAM 10. Further, as shown in FIG. 17B, data that have been encoded by code #1 are read from SDRAM 10 and supplied as input to first decoding circuit 203, and the output from first decoding circuit 203 is supplied by way of output register 206 to syndrome operation circuit 32. In syndrome operation circuit 32, a correction operation is carried out, and the corrected bits are written to SDRAM 10.

Figure 18:
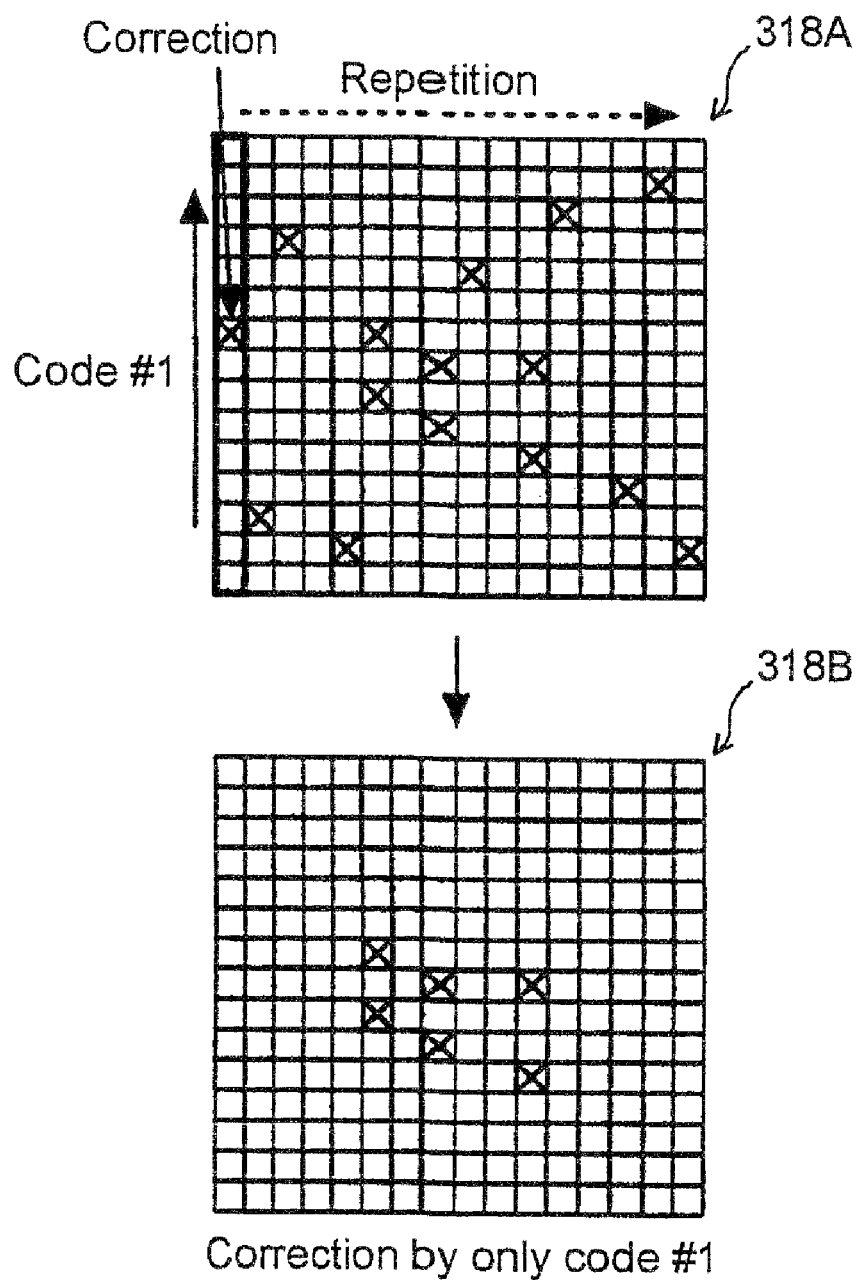
FIG. 18 is a view for explaining the correction results realized by code #1 in the first procedure.

FIG. 18 shows the results of the error correction by means of only code #1 that is carried out in accordance with the process shown in FIG. 16. Fail map 318A gives a schematic representation of the repeated process of error correction by means of only code #1. Here, the error correction in the column direction is repeated 262,144 times, which is the number of columns. As a result of the repeated process, fail map 318B is obtained as the final result of correction by only code #1.

Figure 19:
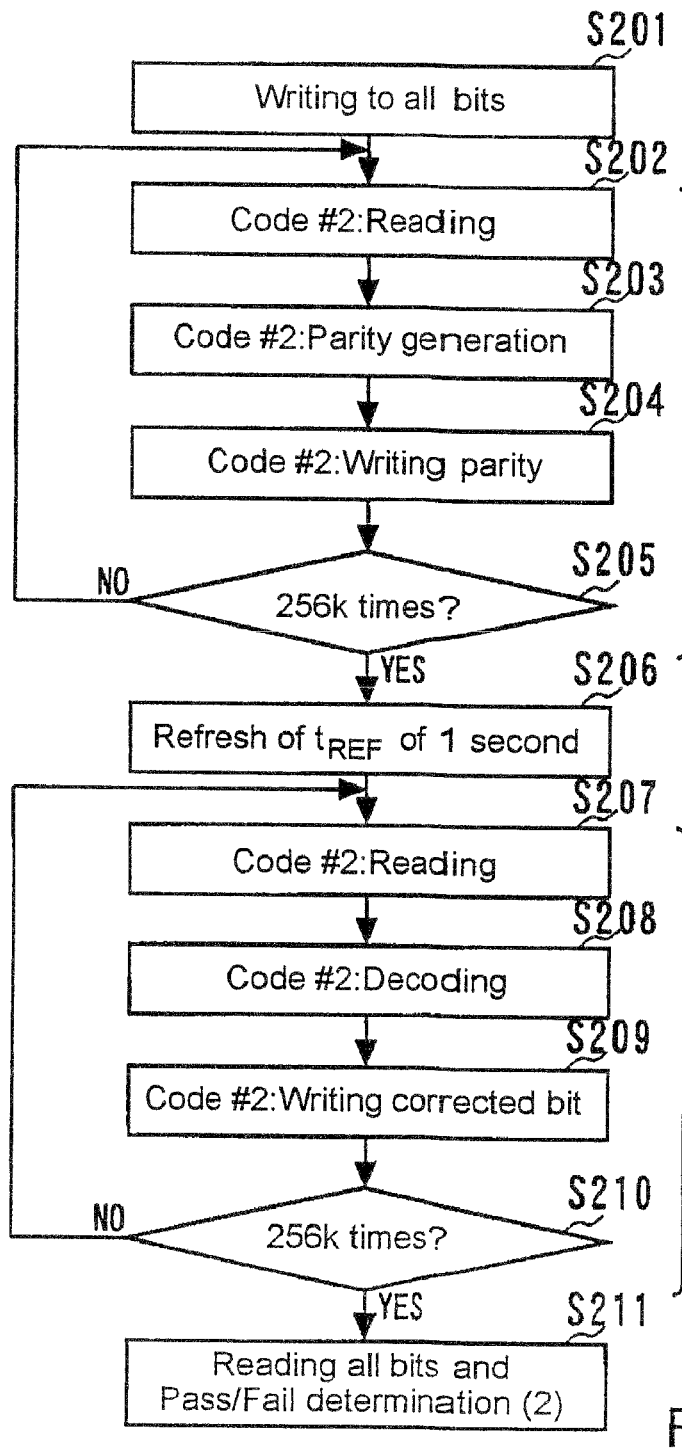
FIG. 19 is a flow chart showing the correction operation by means of code #2 in the first procedure.

In the present embodiment, the same process as the error correction process by only code #1 that was explained using FIGS. 16, 17A and 17B is executed for code #2, which is the other code in the product code, and the results of the process are recorded in the second fail memory. FIG. 19 shows the procedure of the encoding and decoding by code #2.

First, in Step S201, all bits in the memory cell array are written to a prescribed value (ALL 1), following which an encoding process by only code #2 is carried out. In the process of encoding by code #2, data are read by row from the memory cell array in Step S202, parity is generated based on code #2 in Step S203, and parity is written to the parity bit area in Step S204. This type of operation is repeated, for example, 262,144 times to cover the entire area of the SDRAM memory chip, as shown in Step S205.

Following completion of the encoding process by code #2, a refresh operation is repeated at a refresh cycle of $t_{REF}=1$ second in Step S206. In the code #2 decoding process, data are read by row from the memory cell array in Step S207, a correction operation is carried out based on data that have been read by row in Step S208, and the corrected bits are written to the memory cell array in Step S209. This type of operation is repeated, for example, 262,144 times to cover all bits of the SDRAM as shown in Step S210.

After completing the process of decoding by code #2, pass/fail determination is carried out in Step S211, and the addresses of fail bits are recorded in the second fail memory of the memory tester.

In the first procedure, an operation is carried out in the memory tester to find the logical product (AND) of the content of the first fail memory and the content of the second fail memory. It is assumed that a logical value "1" is recorded to the addresses of defective cells and a logical value "0" is recorded in the remaining addresses in both of these fail memories, and the AND value (i.e., logical product value) of the content of both fail memories is calculated for each address. In the results of this AND operation, addresses that have the logical value "1" indicate defective cells that cannot be remedied by the product code ECC process, i.e., cells that must be remedied by redundant cell replacement.

Figure 20A:
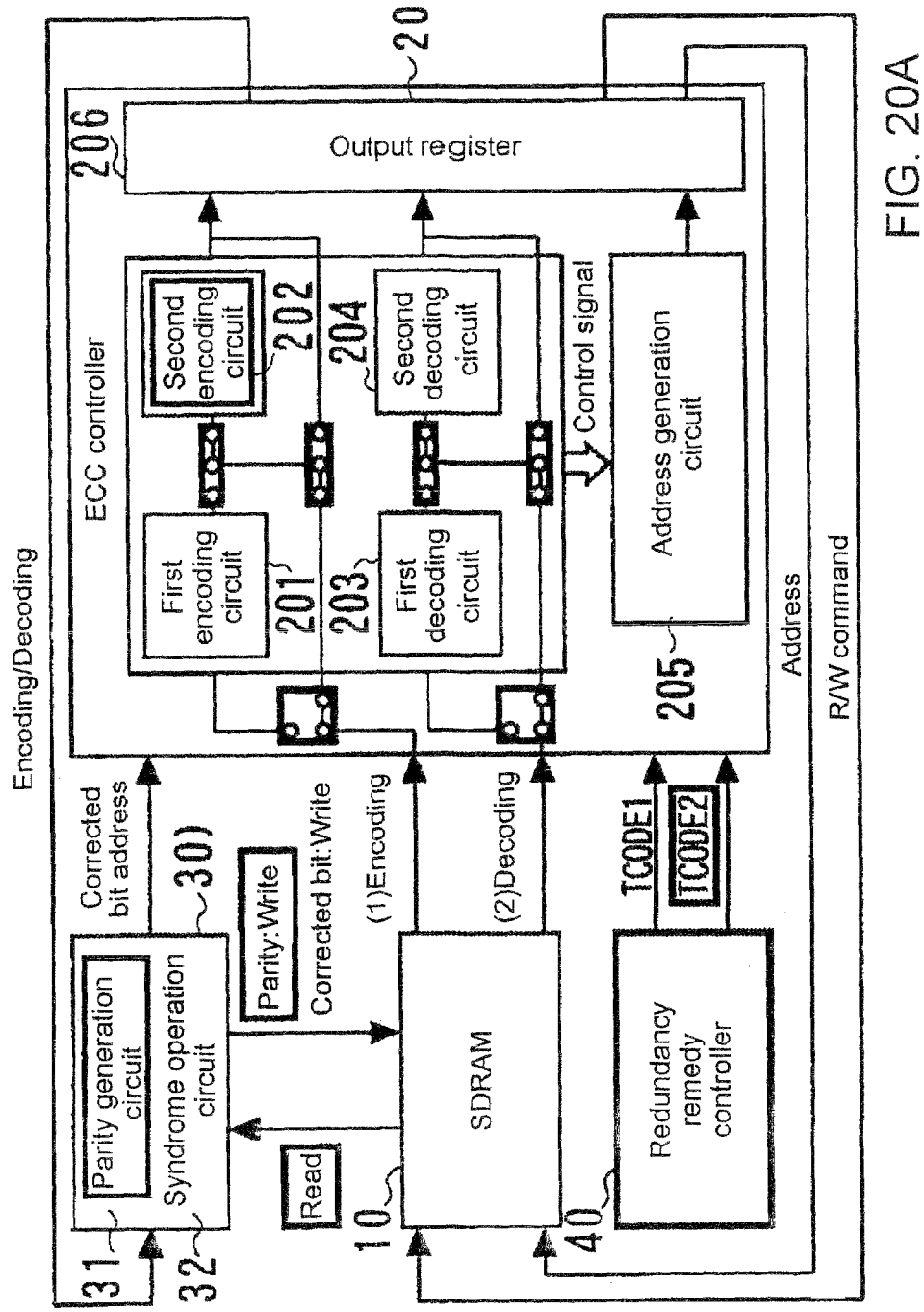
FIGS. 20A and 20B are block diagrams showing the circuit configuration for the correction operation realized by code #2 in the first procedure.
Figure 20B:
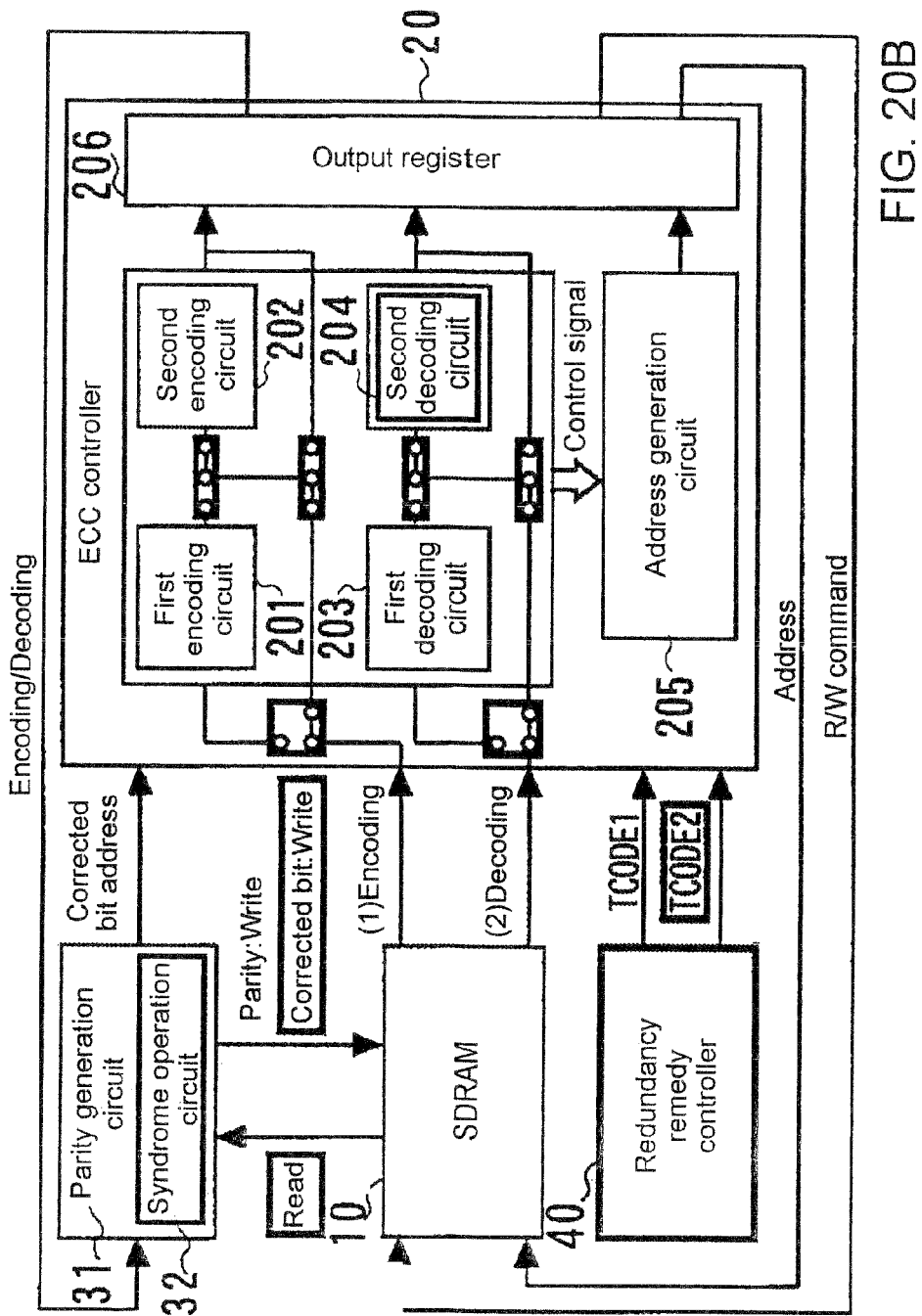

FIGS. 20A and 20B are views for explaining the operations (see FIG. 19) in the ECC circuit that is shown in FIGS. 12A and 12B. As with the circuit that is shown in FIGS. 17A and 17B, parity generation/syndrome operation circuit 30 is provided with parity generation circuit 31 and syndrome operation circuit 32. It is here assumed that control signal TCODE2 from redundancy remedy controller 40 is activated. As shown in FIG. 20A, the data of SDRAM 10 are supplied as input to second encoding circuit 202, and the output from second encoding circuit 202 is supplied from output register 206 to parity generation circuit 31, and the parity that is generated at parity generation circuit 31 is written to SDRAM 10. Further, as shown in FIG. 20B, data that have been encoded by code #2 are read from SDRAM 10 and supplied as input to second decoding circuit 204, and the output of second decoding circuit 204 is supplied by way of output register 206 to syndrome operation circuit 32. A correction operation is carried out in syndrome operation circuit 32, and the corrected bits are written to SDRAM 10.

Figure 21:
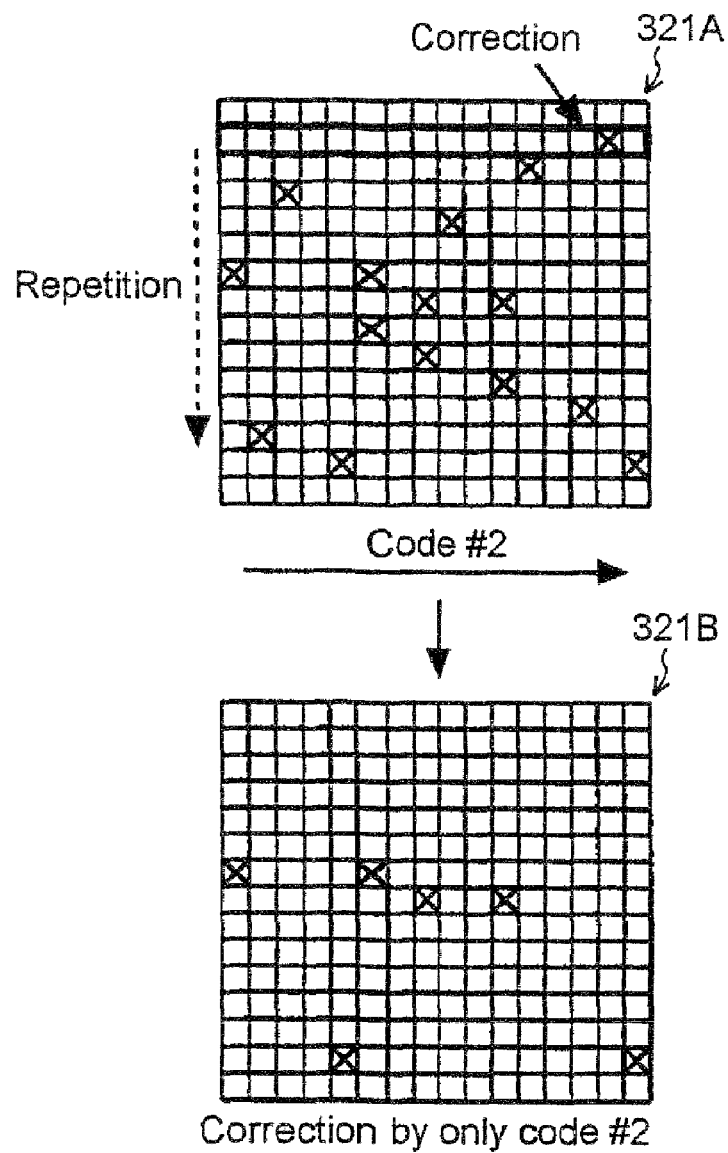
FIG. 21 is a view for explaining the correction results realized by code #2 in the first procedure.

FIG. 21 shows the results of error correction by only code #2 that is carried out in accordance with the process that is shown in FIG. 19. Fail map 321A is a schematic representation of the repeated process of error correction by only code #2. Here, the error correction in the row direction is repeated 262,144 times, which is the number of rows. As a result of this repeated process, fail map 321B is obtained as the result of correction by only code #2.

Figure 22:
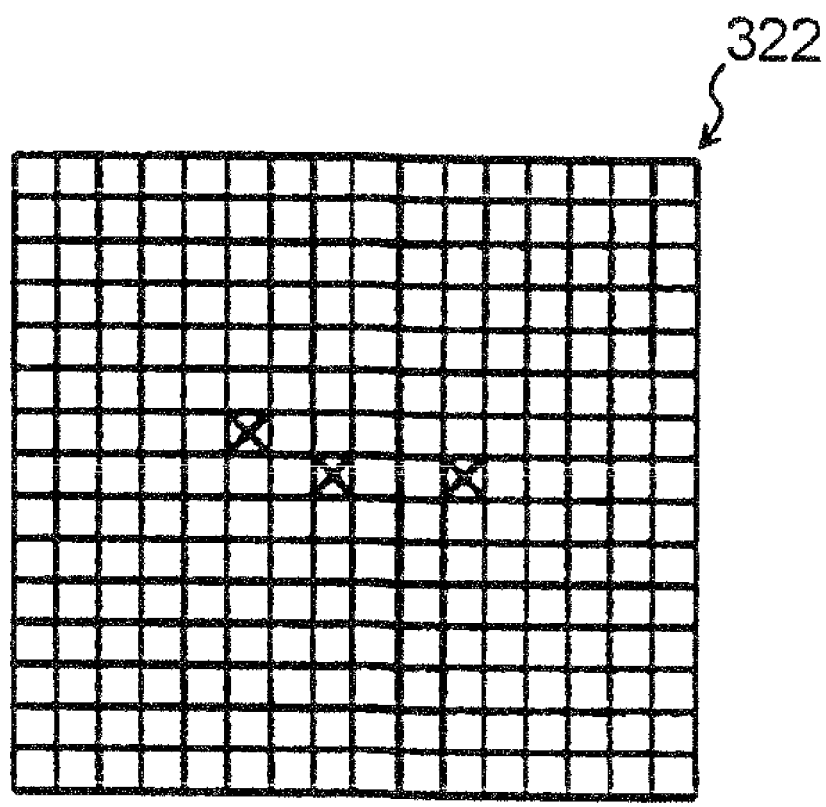
FIG. 22 is a view for explaining the fail bits that are to be remedied by redundant bits that are found by the first procedure.

Fail map 322 that is shown in FIG. 22 shows the results obtained by carrying out an AND operation process of fail map 318B (see FIG. 18) that is obtained as the result of correction by only code #1 and fail map 321B (see FIG. 21) that is obtained as a result of correction by only code #2. The fail bits that are shown in fail map 322 show the objects of remedy by redundant cells.

Figure 8:
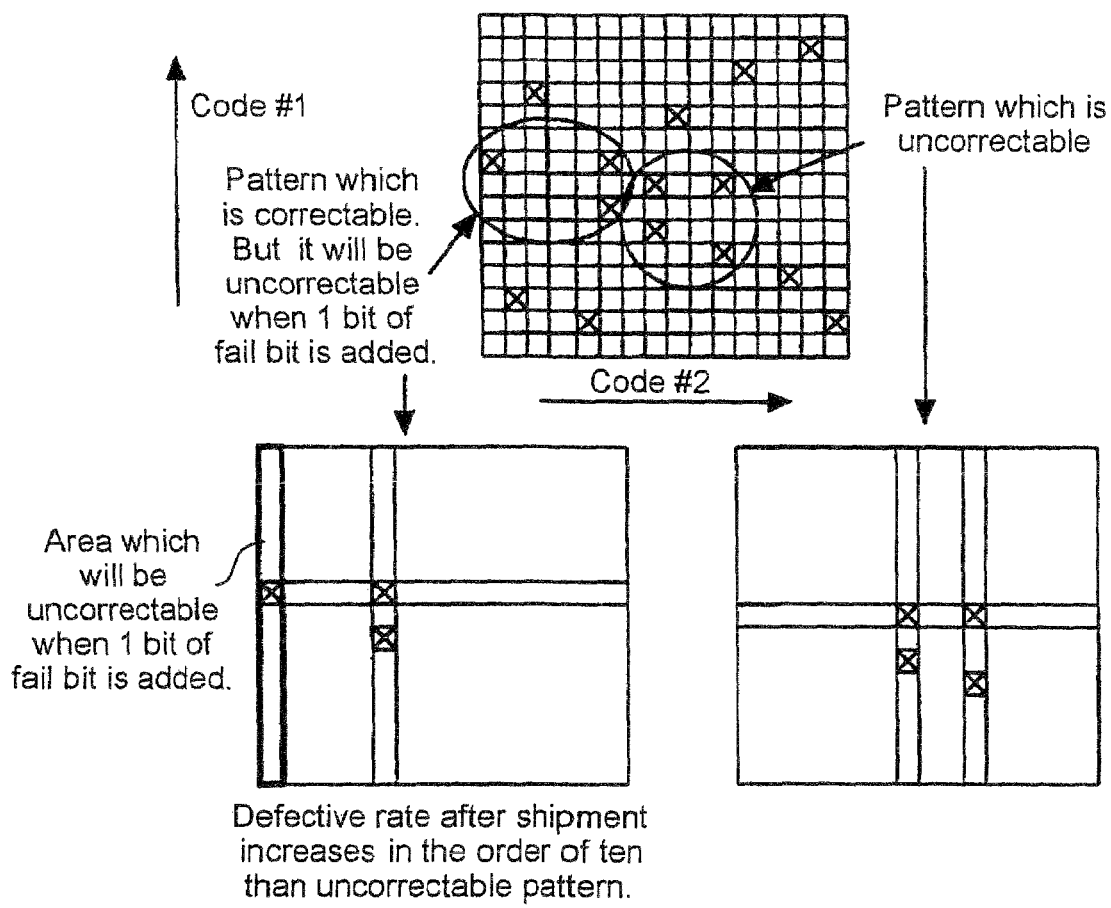
FIG. 8 is an explanatory view of the pattern of fail bits that require redundancy remedies.
Figure 23:
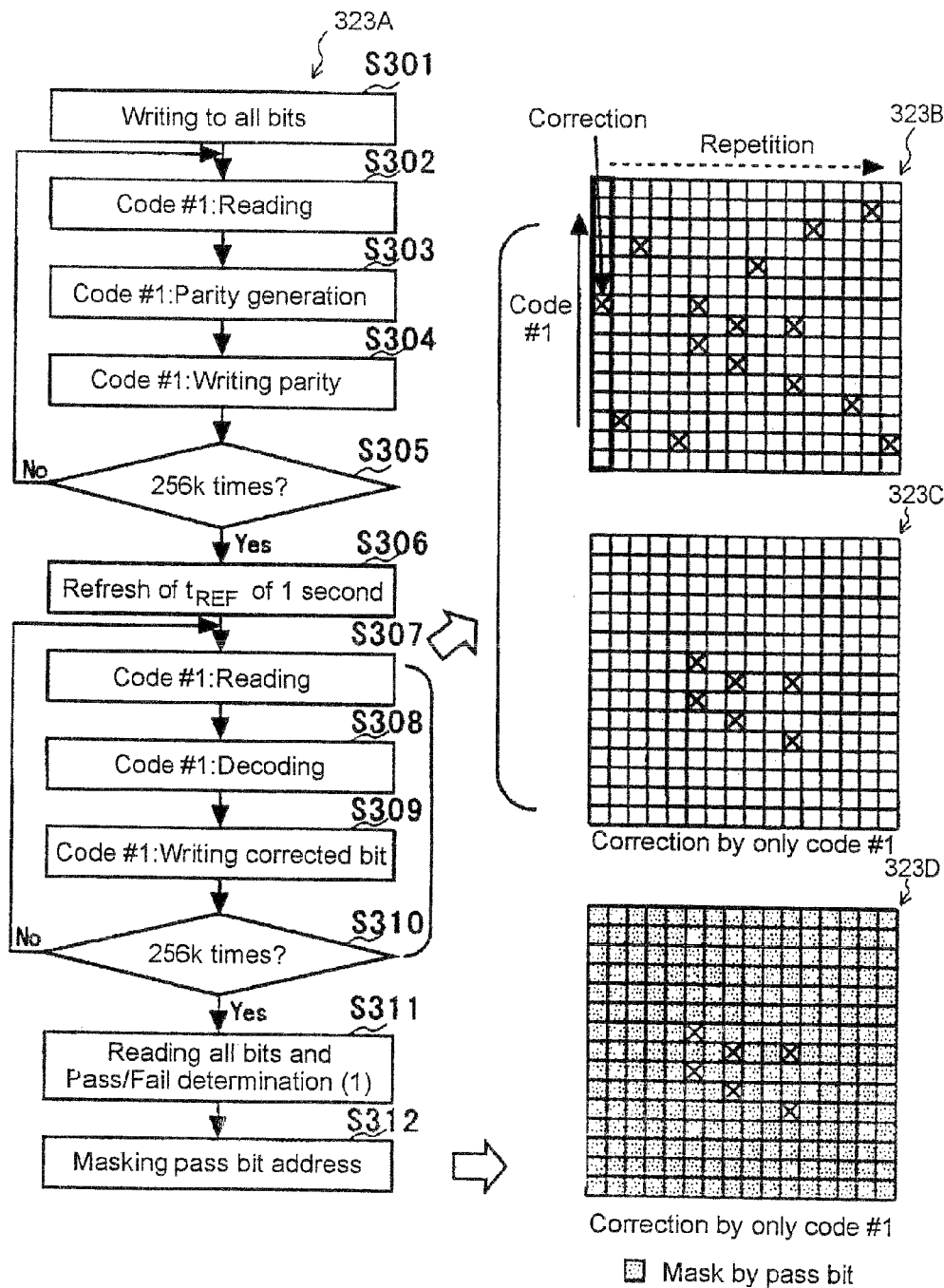
FIG. 23 is a view for explaining the second procedure.

Explanation next regards the details of the second procedure. The second procedure is an attempt to remedy, in the stage of wafer inspection, a pattern of bits that cannot be corrected due to additional failures such as shown in FIG. 8. The application of the second procedure suppresses the market defective rate after shipment of a semiconductor memory device that is based on the SSR technology to, for example, 200 ppm (parts per million) or less. In FIG. 23, flow 323A shows the process that relates to code #1 in the second procedure.

First, all bits are written to a prescribed value (ALL 1) in the memory cell array in Step S301, following which an encoding process by code #1 is carried out. In the process of encoding by code #1, data are read by column from the memory cell array in Step S302, parity is generated based on code #1 in Step S303, and the parity is written to the parity bit area in Step S304. As shown in Step S305, this type of operation is repeated, for example, 262,144 times to cover the entire area of the SDRAM memory chip.

After completion of the process of encoding by code #1, a refresh operation is repeated at a refresh cycle of $t_{REF}=1$ second in Step S306, following which a decoding process is carried out by code #1. In the code #1 decoding process, data are read by column from the memory cell array in Step S307, a correction operation is carried out based on data that have been read by column in Step S308, and the corrected bits are written to the memory cell array in Step S309. This type of operation is repeated, for example, 262,144 times to cover all bits of the SDRAM as shown in Step S310. Fail map 323B shows this repetition, and fail map 323C shows the fail bits following correction by code #1.

Next, all bits are read and pass/fail determination carried out in Step S311, following which the addresses of bits that are not fail bits, i.e., pass bits, are recorded in the fail memory of the memory tester in Step S312. Recording pass bits in the fail memory corresponds to recording the complementary pattern of the arrangement of fail bits in the fail memory. Address mask 323D shows the recorded content of this fail memory.

Figure 24:
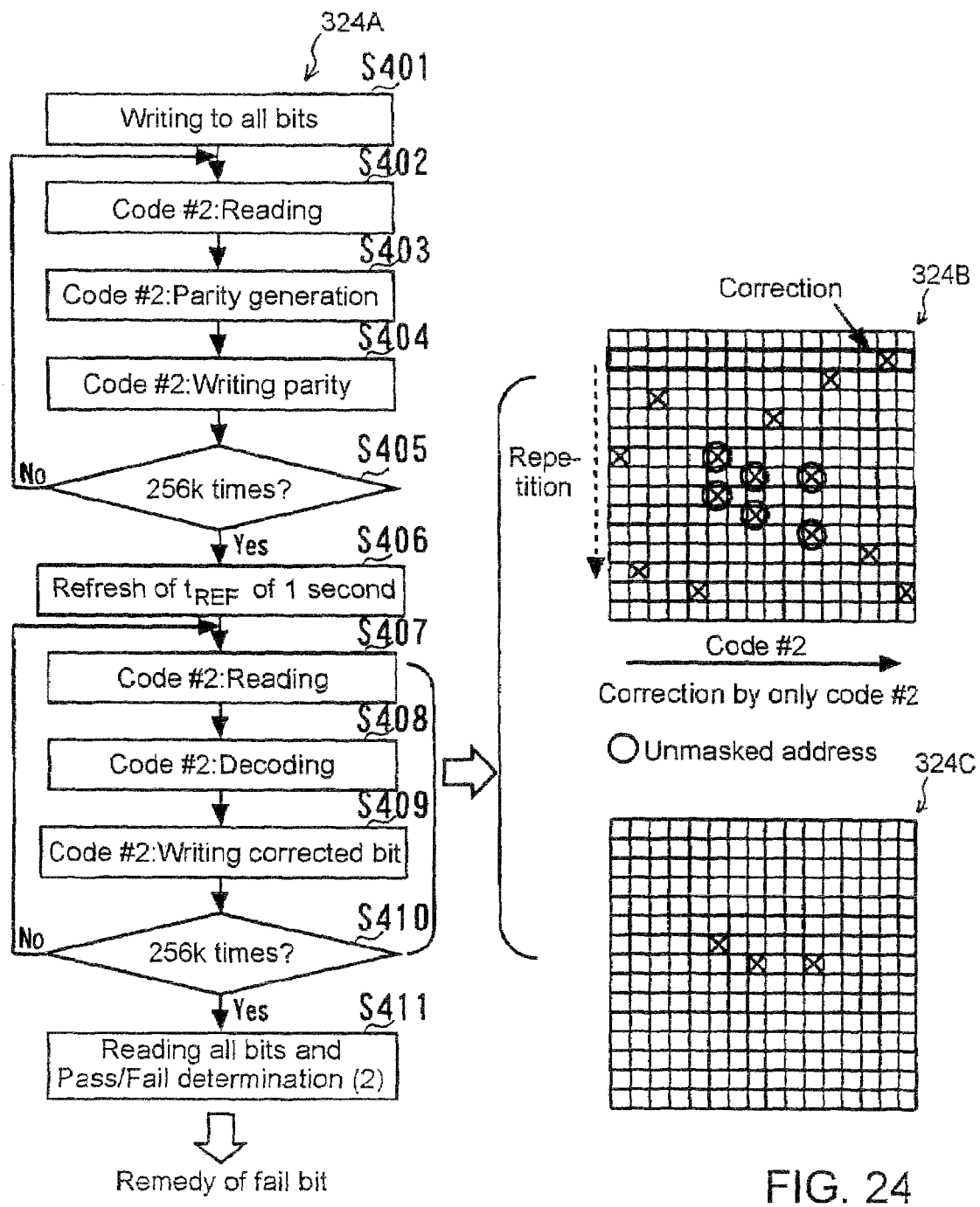
FIG. 24 is a view for explaining the second procedure.

The same operation is next executed for code #2. FIG. 24 shows the process for code #2. As shown by flow 324A, all bits of the memory cell array are written to a prescribed value (ALL 1) in Step S401, following which an encoding process is carried out by means of only code #2. In the encoding process by code #2, data are read by rows from the memory cell array in Step S402, parity is generated based on code #2 in Step S403, and the parity is written to the parity bit area in Step S404. This type of operation is carried out, for example, 262,144 times to cover the entire area of the SDRAM memory chip as shown in Step S405.

A refresh operation is next repeated at a refresh cycle of $t_{REF}=1$ second in Step S406, following which a process of decoding by code #2 is carried out. In the process of decoding by code #2, data are read by columns from the memory cell array in Step S407, a correction operation is carried out based on the data that are read by columns in Step S408, and the corrected bits are written to the memory cell array in Step S409. These operations are repeated, for example, 262,144 times for all bits of the SDRAM as shown in Step S410. Fail map 324B shows this repetition.

All bits are next read in Step S411, and pass/fail determination then carried out. This pass/fail determination detects fail bits that cannot be corrected by code #2. Masking these detection results by address mask 315D that is stored in the fail memory allows detection of the fail bits that cannot be remedied in product code ECC, and the addresses of these detected fail bits are recorded. Fail map 316C shows the fail bits that have been detected. These detected fail bits are subsequently remedied by redundant bits.

Although the preceding explanation regarding a preferable embodiment of the present invention describes an example in which a clock synchronous-type SDRAM is used as memory, the present invention can of course also be applied to asynchronous DRAM. In addition, the present invention can also be applied to semiconductor devices that are provided with any memory that is equipped with any product code ECC circuit.

While a preferred embodiment of the present invention has been described using specific term such description is for illustrative purposes only, and it is to be understood that changes and variations may be made without departing from the spirit or scope of the following claims.

What is claimed is:

1. A test method of a dynamic semiconductor memory device, said dynamic semiconductor memory device comprising a memory cell array having a storage area of parity data that is realized by product code that is composed of a first code and a second code; said test method comprising steps of:

writing prescribed value data to said memory cell array; and as an encoding process realized by said first code, reading data from said memory cell array to generate a first parity, and writing said first parity that has been generated to said memory cell array;

following a refresh operation of a prescribed interval, reading data encoded by said first code from said memory cell array, decoding the read data, and writing first corrected bits to said memory cell array;

reading data from said memory cell array to which said first corrected bits have been written, determining pass/fail, and recording the determination results to a first fail memory;

writing prescribed value data to said memory cell array, and, as an encoding process realized by said second code, reading data from said memory cell array to generate a second parity, and writing said second parity that has been generated to said memory cell array;

following a refresh operation of a prescribed interval, reading data encoded by said second code from said memory cell array, decoding the read data, and writing second corrected bits to said memory cell array;

reading data from said memory cell array to which said second corrected bits have been written, determining pass/fail, and recording the determination results to a second fail memory; and executing a prescribed logical operation relating to contents of said first fail memory and contents of said second fail memory, and based on results of said logical operation, deriving cells that are to be remedied by means of redundant cells.

2. The test method according to claim 1, wherein said prescribed logical operation is an AND operation.

3. A test method of a dynamic semiconductor memory device, said dynamic semiconductor memory device comprising a memory cell array having a storage area of parity data that is realized by product code composed of a first code and a second code; said test method comprising steps of:

writing prescribed value data to said memory cell array; and as an encoding process realized by said first code, reading data from said memory cell array to generate a first parity, and writing said first parity that has been generated to said memory cell array;

following a refresh operation of a prescribed interval, reading data encoded by said first code from said memory cell array, decoding the read data, and writing first corrected bits to said memory cell array;

reading data from said memory cell array to which said first corrected bits have been written, determining pass/fail, and producing a complementary pattern of the determination results as mask data;

writing prescribed value data to said memory cell array, and, as an encoding process realized by said second code, reading data from said memory cell array to generate a second parity, and writing said second parity that has been generated to said memory cell array;

following a refresh operation of a prescribed interval, reading data encoded by said second code from said memory cell array, decoding the read data, and writing second corrected bits to said memory cell array; and reading data from said memory cell array to which said second corrected bits have been written and determining pass/fail, masking the determination results by said mask data to generate fail information, and, based on said fail information, deriving cells that are to be remedied by means of redundant cells.

* * * * *